United States Patent
Takahashi et al.

(10) Patent No.: US 7,332,746 B1
(45) Date of Patent: Feb. 19, 2008

(54) LIGHT-EMITTING APPARATUS

(75) Inventors: Yuji Takahashi, Nishikasugai-gun (JP); Koichi Ota, Nishikasugai-gun (JP); Naoki Yoshimura, Nishikasugai-gun (JP); Kuniyoshi Kondo, Nishikasugai-gun (JP)

(73) Assignee: Toyoda Gosei, Co., Ltd., Nishikasugai-Gun, Aichi (JP)

( * ) Notice: Subject to any disclaimer, the term of this patent is extended or adjusted under 35 U.S.C. 154(b) by 0 days.

(21) Appl. No.: 09/654,501

(22) Filed: Sep. 1, 2000

(30) Foreign Application Priority Data

Sep. 2, 1999 (JP) .................. 11-249350
Dec. 17, 1999 (JP) .................. 11-359920

(51) Int. Cl.
*H01L 33/00* (2006.01)
(52) U.S. Cl. .................. 257/98; 313/501; 313/502; 313/503; 313/E33.034; 313/E33.061
(58) Field of Classification Search ............ 257/98; 313/501–503
See application file for complete search history.

(56) References Cited

U.S. PATENT DOCUMENTS

| | | | | |
|---|---|---|---|---|
| 5,294,870 A | * | 3/1994 | Tang et al. | 313/504 |
| 5,661,074 A | * | 8/1997 | Tischler | 438/32 |
| 5,701,321 A | * | 12/1997 | Hayafuji et al. | 372/44 |
| 5,717,289 A | * | 2/1998 | Tanaka | 313/503 |
| 5,798,536 A | * | 8/1998 | Tsutsui | 257/99 |
| 5,804,834 A | * | 9/1998 | Shimoyama et al. | 257/22 |
| 5,813,753 A | | 9/1998 | Vriens et al. | |
| 5,847,507 A | * | 12/1998 | Butterworth et al. | 313/512 |
| 5,851,905 A | * | 12/1998 | McIntosh et al. | 438/492 |
| 5,877,558 A | * | 3/1999 | Nakamura et al. | 257/749 |
| 5,958,296 A | * | 9/1999 | Do et al. | 252/301.4 R |
| 5,959,316 A | | 9/1999 | Lowery | |
| 5,962,971 A | | 10/1999 | Chen | |
| 5,982,092 A | | 11/1999 | Chen | |
| 5,998,925 A | | 12/1999 | Shimizu et al. | |
| 6,084,250 A | * | 7/2000 | Justel et al. | 257/89 |
| 6,153,123 A | * | 11/2000 | Hampden-Smith et al. | 252/301.45 |
| 6,166,489 A | * | 12/2000 | Thompson et al. | 313/506 |

(Continued)

FOREIGN PATENT DOCUMENTS

JP     10-11002     *  1/1998

(Continued)

OTHER PUBLICATIONS

Phosphor Handbook, Shionaya et al, ed., 1999, pp. 192, 193, 394.*

(Continued)

*Primary Examiner*—Jerome Jackson
(74) *Attorney, Agent, or Firm*—McGinn IP Law Group, PLLC

(57) ABSTRACT

A novel configuration of a light-emitting apparatus that can emit white light, in which a primary light source composed of a group III nitride compound semiconductor is used in combination with a secondary light source including a fluorescent material which emits light of a green luminescent color when the fluorescent material is excited by light emitted from the primary light source. A tertiary light source for emitting red light may be further used in combination with the primary and secondary light sources.

12 Claims, 16 Drawing Sheets

U.S. PATENT DOCUMENTS

| | | | |
|---|---|---|---|
| 6,222,203 B1 * | 4/2001 | Ishibashi et al. | 257/88 |
| 6,234,648 B1 * | 5/2001 | Borner et al. | 362/235 |
| 6,252,254 B1 * | 6/2001 | Soules et al. | 257/89 |
| 6,307,218 B1 * | 10/2001 | Steigerwald et al. | 257/99 |
| 6,335,217 B1 * | 1/2002 | Chiyo et al. | 438/46 |
| 6,340,824 B1 * | 1/2002 | Komoto et al. | 257/99 |
| 6,350,041 B1 * | 2/2002 | Tarsa et al. | 362/231 |
| 6,351,069 B1 * | 2/2002 | Lowery et al. | 313/512 |
| 6,513,949 B1 | 2/2003 | Marshall et al. | |
| 6,577,073 B2 | 6/2003 | Shimizu et al. | |

FOREIGN PATENT DOCUMENTS

| | | | |
|---|---|---|---|
| JP | 10163535 | | 6/1998 |
| JP | 10242513 | | 9/1998 |
| JP | 11-177141 | * | 7/1999 |

OTHER PUBLICATIONS

Phosphor Handbook, 1998, Shionaya et ak., ed., CRC Press, pp. 190, 252.*

* cited by examiner

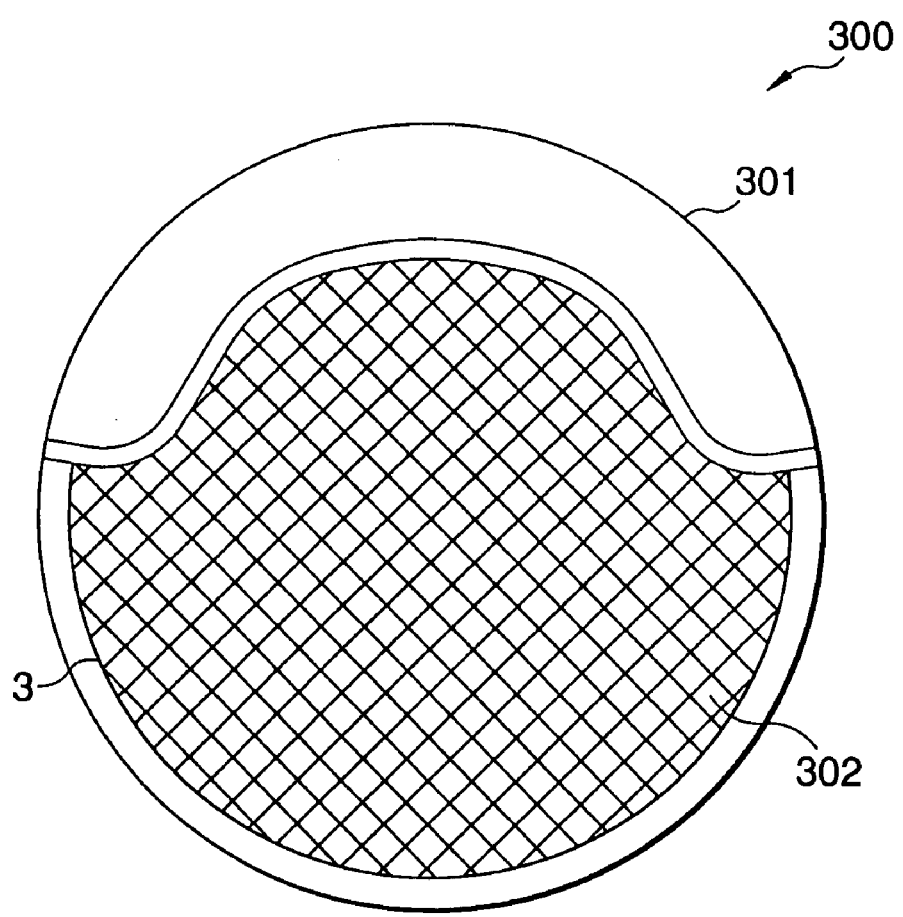

LIGHT-EMITTING APPARATUS

BACKGROUND OF THE INVENTION

1. Field of the Invention

The present invention relates to a light-emitting apparatus. Particularly, it relates to a light-emitting apparatus which can emit white light as a whole by using a group III nitride compound semiconductor light-emitting device and a fluorescent material in combination.

The present application is based on Japanese Patent Applications No. Hei. 11-249350 and 11-359920, which are incorporated herein by reference.

2. Description of the Related Art

A light-emitting apparatus which can emit white light by using a blue light-emitting diode and a fluorescent material of photoluminescence in combination has been disclosed in Unexamined Japanese Patent Publication No. Hei. 10-242513. In the light-emitting apparatus described in 10-242513, an yttrium-aluminum-garnet fluorescent material activated by cerium (Ce) to absorb light emitted from the blue light-emitting diode and emit yellow light is used as the fluorescent material so that the blue light emitted from the light-emitting diode and the yellow light emitted from the fluorescent material are mixed together to thereby generate white light.

SUMMARY OF THE INVENTION

The inventors of the present invention have eagerly investigated various combinations of light-emitting devices and fluorescent materials to provide a novel configuration of a light-emitting apparatus which can emit white light.

As a result, it has been found that there is a ZnS fluorescent material which exhibits an absorption spectrum to light emitted from a light-emitting device and which emits light when excited by the light emitted from the light-emitting device so that the light emitted from the fluorescent material and the light emitted from the light-emitting device are mixed together to thereby generate white light.

The present invention is a fruit of the aforementioned investigation. The configuration according to a first aspect of the present invention is as follows. That is, there is provided a light-emitting apparatus comprising: a primary light source including a semiconductor light-emitting device with an emission wavelength of from 380 nm to 500 nm; and a secondary light source including a fluorescent material composed of ZnS:Cu, Au, Al; wherein the secondary light source emits light on the basis of light given from the primary light source so that light of the secondary light source and the light of the primary light source are mixed together to thereby generate light different in luminescent color from the light emitted from the primary light source.

According to the aforementioned configuration, the fluorescent material emits light different in wavelength from light emitted from the primary light source when excited by the light emitted from the primary light source. Hence, the light emitted from the secondary light source including the fluorescent material and the light emitted from the primary light source are mixed together, so that light different in luminescent color from the light emitted from the primary light source is taken out. Because a fluorescent material excited efficiently by light with an emission wavelength of from 380 nm to 500 nm to thereby emit light is used as the fluorescent material, a light-emitting apparatus of high luminance and high efficiency is obtained.

Moreover, according to the inventors' investigation, it has been found that a green component of light emitted from a fluorescent material becomes rich when ZnS:Eu, YVO$_4$:Ce or Y$_2$O$_2$S:Ce is used as the fluorescent material.

A material for forming a semiconductor light-emitting device constituting a primary light source is not particularly limited but, for example, a material with an emission wavelength of from 380 nm to 500 nm is used. Preferably, a material with an emission wavelength of from 420 nm to 490 nm is used. More preferably, a material with an emission wavelength of from 450 nm to 475 nm is used.

A group III nitride compound semiconductor is preferably used as the semiconductor light-emitting device. The "group III nitride compound semiconductor light-emitting device" means a semiconductor light-emitting device having a group III nitride compound semiconductor layer. The group III nitride compound semiconductor is represented by the general formula Al$_X$Ga$_Y$In$_{1-X-Y}$N ($0 \leq X \leq 1$, $0 \leq Y \leq 1$, $0 \leq X+Y \leq 1$), which includes so-called binary compounds such as AlN, GaN and InN, and so-called ternary compounds such as Al$_X$Ga$_{1-X}$N, Al$_X$In$_{1-X}$N and Ga$_X$In$_{1-X}$N ($0 \leq X \leq 1$ in above). The group III elements may be partially replaced by boron (B), thallium (Tl). The nitrogen (N) may be partially replaced by phosphorus (P) arsenic (As), antimony (Sb), bismuth (Bi). A device function portion of the light-emitting device is preferably constituted by a binary or ternary group III nitride compound semiconductor described above.

The group III nitride compound semiconductor may contain any optional dopant. Si, Ge, Se, Te, C may be used as n-type impurities. Mg, Zn, Be, Ca, Sr, Ba may be used as p-type impurities. Incidentally, after doped with p-type impurities, the group III nitride compound semiconductor may be subjected to electron beam irradiation, plasma irradiation or heat by a furnace.

The group III nitride compound semiconductor may be formed by a metal organic chemical vapor deposition method (MOCVD method) or may be formed by any other known method such as a molecular beam epitaxy method (MBE method) a halide vapor phase epitaxy method (HVPE method), a sputtering method, an ion-plating method, an electron shower method.

A material of a substrate for growing the group III nitride compound semiconductor layer is not particularly limited so long as the group III nitride compound semiconductor layer can be grown on the substrate. Examples of the material of the substrate include sapphire, spinel, silicon, silicon carbide, zinc oxide, gallium phosphide, gallium arsenide, magnesium oxide, manganese oxide, group III nitride compound semiconductor single crystal. Especially, a sapphire substrate is preferably used. More especially, face a of a sapphire substrate is preferably used.

A fluorescent material contained in a secondary light source is composed of at least one member selected from the group consisting of ZnS:Cu, Au, Al; ZnS:Cu, Al; ZnS:Cu; ZnS:Mn; ZnS:Eu; YVO$_4$:Eu; YVO$_4$:Ce; Y$_2$O$_2$S:Eu and Y$_2$O$_2$S:Ce. The "ZnS:Cu, Au, Al" means a ZnS fluorescent material of photoluminescence having ZnS as a base and activated by Cu, Au and Al respectively. The "ZnS:Cu, Al", "ZnS:Cu", "ZnS:Mn" and "ZnS:Eu" mean fluorescent materials of photoluminescence having ZnS as a base and activated by Cu and Al, by Cu, by Mn and by Eu respectively. Similarly, the "YVO$_4$:Eu" and "YVO$_4$:Ce" mean fluorescent materials of photoluminescence having YVO$_4$ as a base and activated by Eu and by Ce respectively. Similarly, the "Y$_2$O$_2$S:Eu" and "Y$_2$O$_2$S:Ce" mean fluorescent materials having Y$_2$O$_2$ as a base and activated by Eu and by Ce respectively. Each of these fluorescent materials has an absorption spectrum to light in a wavelength range of from blue to green and emits light with a wavelength longer than the excitation wavelength.

Among the aforementioned fluorescent materials, ZnS:Eu, YVO$_4$:Ce and Y$_2$O$_2$S:Ce exhibit longer emission wavelengths than the other fluorescent materials when excited by light in a wavelength range of from blue to green. That is, the color of light emitted from ZnS:Eu, YVO$_4$:Ce and Y$_2$O$_2$S:Ce is greener, so that mixture light of the light emitted from these fluorescent materials and the light emitted from the primary light source becomes whiter. Hence, at least one member selected from the group consisting of ZnS:Eu, YVO$_4$:Ce and Y$_2$O$_2$S:Ce is preferably used as the fluorescent material in order to obtain whiter emission light.

The secondary light source including the fluorescent material is provided in a position to be irradiated with light emitted from the primary light source. The secondary light source emits light when excited by the light emitted from the primary light source. The light emitted from the secondary light source and the light emitted from the primary light source are mixed together so that light of a color different from the color of the primary light source is generated as a whole. If a light-emitting device with a different emission wavelength is used, the luminescent color to be obtained can be changed. If the composition of the fluorescent material is changed, the luminescent color can be also changed.

The use of the ZnS fluorescent material has the following advantage compared with the case where a rare-earth element-activated fluorescent material is used as another typical fluorescent material. The ZnS fluorescent material does not need a large concentration of the activator compared with the rare-earth element-activated fluorescent material. Hence, ZnS synthesized in advance is used so that dispersion of the activator into the ZnS lattice and growth of ZnS particles are performed by sintering. On the other hand, most of rare-earth element-activated fluorescent materials need a relatively complex reaction in which generation of compounds, dispersion of the activator and growth of particles are performed by sintering. Moreover, the sintering temperature for the ZnS fluorescent material is generally lower. Thus, the use of the ZnS fluorescent material is advantageous in terms of synthesis of the fluorescent material.

In use, the fluorescent material is dispersed into a layer composed of a light-transmissible material. Examples of the light-transmissible material to be used are epoxy resin, silicone resin, urea resin, glass. It is a matter of course that one material selected from these materials may be used singly. Moreover, a plurality of materials selected optionally from these materials may be used in combination.

The concentration distribution of the fluorescent material in the light-transmissible material can be changed in accordance with the purpose of use, the working condition. That is, the amount of the fluorescent material is changed continuously or stepwise as the location of the fluorescent material comes nearer the light-emitting device. For example, the concentration of the fluorescent material in a portion nearer the light-emitting device is made higher. In this case, the fluorescent material can be efficiently irradiated with light emitted from the light-emitting device. The fluorescent material is, however, easily affected by heat generated in the light-emitting device, so that deterioration of the fluorescent material becomes a subject of discussion. When the concentration of the fluorescent material is contrariwise set to decrease as the location of the fluorescent material comes nearer the light-emitting device, deterioration of the fluorescent material caused by heat generated in the light-emitting device is suppressed.

The layer composed of the light-transmissible material containing the fluorescent material is provided in a direction of light emission of the primary light source. The layer is preferably formed so as to cover the light emission side of the primary light source. Another layer of a light-transmissible material or a space may be provided between the layer and the primary light source.

As described above, the secondary light source is constituted by a layer of a light-transmissible material containing a specific fluorescent material dispersed into the layer. When light emitted from the primary light source passes through the layer, the light emitted from the primary light source and the light emitted from the secondary light source are mixed together automatically in the layer. The mode for mixing the light of the primary light source and the light of the secondary light source is, however, not limited to the above description. For example, the fluorescent material is disposed in the form of islands in the surrounds of the primary light source. Light emitted from the primary light source may go between islands of the fluorescent material so that the light of the primary light source and light emitted from the fluorescent material can be mixed together in a sealing member. In this case, the light of the primary light source is not transmitted through the islands of the fluorescent material. Alternatively, in the light-emitting apparatus, the fluorescent material may be disposed in a position out of the optical axis of the light emitted from the primary light source and the light emitted from the fluorescent material is condensed in a direction of the optical axis by use of a reflection plate so that the light of the primary light source and the light of the fluorescent material as the secondary light source are mixed.

The light-emitting apparatus according to the present invention may be applied to a light-emitting diode display device (hereinafter referred to as "LED display device") which displays white with high density and high precision. In the background-art full-color LED display device, respective LEDs for red, green and blue (RGB) were used in combination as one pixel so that white light emission was obtained by mixture of the colors of light emitted from the respective LEDs. That is, light emission from three LEDs was required for display of white, so that the display region for white light was large compared with the display region for light emission of a single color such as green, red. Hence, white could not be displayed with precision so high as green.

There is a possibility that white light emission can be achieved singly by the light-emitting apparatus according to the present invention. Hence, when the light-emitting apparatus according to the present invention is used in combination with respective RGB LEDs, white display can be obtained with density and precision as high as emission light of green, red. Moreover, there is an advantage that white display can be adjusted by control of the lighting condition of one light-emitting device. Moreover, because white display is not obtained by mixture of the colors of the light emitted from respective RGB LEDs as in the background art, the visual color can be prevented from changing in accordance with the viewing angle and color irregularity can be reduced. In addition, when the light-emitting apparatus according to the present invention is used in combination with respective RGB LEDs, white display by mixture of RGB colors and white display by the light-emitting apparatus can be performed simultaneously so that improvement of light intensity and luminance in white display can be achieved.

A second aspect of the present invention will be described below.

The inventors of the present invention have made investigation more in detail to obtain white light emission with high luminance. As a result, the following problem to be solved has been found. That is, in the configuration according to the first aspect of the present invention, a part of light emitted from a semiconductor blue light-emitting device excites a fluorescent material to emit light so that the light emitted from the fluorescent material and the light directly taken out from the semiconductor light-emitting device are mixed together to thereby obtain white light emission. The emission spectrum of the fluorescent material used in the first aspect of the present invention and excited by blue light, however, has a peak in a wavelength range of from yellow to green. Hence, the light obtained by mixture of the light emitted from the excited fluorescent material and the light emitted from the semiconductor blue light-emitting device was bluish white. In other words, a red component of the white light emission according to the first aspect of the present invention was so weak that it could not be safely that the white light emission was the most suitable as a white light source for illumination. Particularly when the light-emitting apparatus according to the first aspect of the present invention was used as a back-lighting unit of a full-color liquid-crystal display, there was a problem that display of red becomes weak.

The second aspect of the present invention is provided to solve the aforementioned problem. An object of the present invention is to provide a light-emitting apparatus which can emit white light more preferably as a white light source for illumination. The configuration thereof is as follows. That is, there is provided a light-emitting apparatus which comprises: a primary light source including a semiconductor light-emitting device for emitting blue light; a secondary light source including a first fluorescent material for absorbing light of the primary light source and emitting green light; and a tertiary light source for emitting red light; wherein light of the primary light source, light of the secondary light source and light of the tertiary light source are mixed together to thereby generate white light.

According to the aforementioned configuration, red light emitted from the tertiary light source is supplied, in addition, to blue light emitted from the semiconductor light-emitting device as the primary light source and green light emitted from the fluorescent material excited by a part of the blue light as the secondary light source. As a result, three kinds of RGB light as three primary colors of light can be mixed with good balance to thereby obtain good-quality white light. Moreover, the fluorescent material which is used as the secondary light source converts blue light into green light. Because the conversion of blue light into green light is performed efficiently, blue light emitted from the primary light source can be utilized effectively. As a result, a high-luminance light-emitting apparatus can be provided.

Assume now that LEDs are used as light-emitting devices. At present, the light output of a blue LED is very larger than the light output of a red LED. When a part of light emitted from the blue LED as the primary light source is used for exciting the fluorescent material as shown in the second aspect of the present invention, the blue light component is reduced so that the primary light source can be balanced, in terms of light emission, with the tertiary light source which emits red light. In other words, the blue LED can be made to emit light with full power approximately. As a result, the intensity of green light emitted from the fluorescent material becomes high, so that the light-emitting apparatus can be operated efficiently.

The configuration of the primary light source and the method for forming the primary light source are the same as those of the primary light source according to the first aspect of the present invention.

The first fluorescent material contained in the secondary light source can emit green light when excited by blue light. Preferably, the fluorescent material is composed of at least one member selected from the group consisting of $Zn,S:Cu, Au, Al$; $ZnS:Cu, Al$; $ZnS:Cu$; $ZnS:Mn$; $ZnS:Eu$; $YVO_4:Eu$; $YVO_4:Ce$; $Y_2O_2S:Eu$; and $Y_2O_2S:Ce$. Each fluorescent material including $Zn,S:Cu, Au, Al$; $ZnS:Cu, Al$; $ZnS:Cu$; $ZnS:Eu$; $YVO_4:Ce$; and $Y_2O_2S:Ce$ has an absorption spectrum to blue light (from blue to blue-green) and emits green light with a wavelength longer than the excitation wavelength, whereas at least the fluorescent materials of $ZnS:Mn$; $YVO_4:Eu$; and $Y_2O_2S:Eu$ emit red light.

The secondary light source including the first fluorescent material is provided in a position to be irradiated with light emitted from the primary light source and emits light when excited by the light emitted from the primary light source. The light emitted from the secondary light source, the light emitted from the primary light source and light emitted from the tertiary light source which will be described later are mixed together so that white light emission is obtained as a whole. If a light-emitting device with a different emission wavelength is used as the primary light source, the resulting light color can be changed. If the composition of the fluorescent material is changed, the resulting light color can be also changed.

As explained above in the first aspect of the present invention, the use of the ZnS fluorescent material is advantageous, in terms of synthesis of the fluorescent material, to the use of a rare-earth element-activated fluorescent material as another typical fluorescent material.

The method for arranging the first fluorescent material is the same as that in the first aspect of the present invention. The first fluorescent material may be dispersed into a layer composed of light-transmissible material or may be disposed in the form of islands around the primary light source. The concentration distribution of the fluorescent material can be changed in accordance with the position relative to the primary light source in the same manner as in the first aspect of the present invention.

A second fluorescent material or semiconductor light-emitting device can be used as the tertiary light source. The second fluorescent material can emit pink or red light when excited by blue light. Preferably, CaS:Eu is used as in the second fluorescent material. The second fluorescent material is provided in a position to be irradiated with light emitted from the primary light source in the same manner as in the first fluorescent material and emits light when excited by the light emitted from the primary light source. The method for arranging the second fluorescent material is the same as that of the first fluorescent material. That is, the second fluorescent material may be dispersed into a layer composed of a light-transmissible material or may be disposed in the form of islands around the primary light source. Preferably, the second fluorescent material is dispersed into the light-transmissible layer in which the first fluorescent material constituting the secondary light source is dispersed. In other words, a light-transmissible layer in which two kinds of fluorescent materials constituting the secondary and tertiary light sources respectively are dispersed is provided around the primary light source. It is a matter of course that two layers having fluorescent materials dispersed respectively are provided around the primary light source. Incidentally, the concentration distribution of the second fluorescent material can be changed in accordance with the position relative to the primary light source in the same manner as in the first fluorescent material.

The semiconductor light-emitting device used as the tertiary light source is not particularly limited so long as the semiconductor light-emitting device can emit red light. A known device can be used as the semiconductor light-emitting device. For example, a device of gallium-aluminum-arsenic is used.

The method for arranging the semiconductor red light-emitting device is not particularly limited. Preferably, the semiconductor red light-emitting device is disposed adjacently to or around the primary light source. Further, the positional relation of the semiconductor red light-emitting device with respect to the secondary light source is not particularly limited. When, for example, a layer containing the first fluorescent material is formed as the secondary light source, the layer may be provided around the primary light source whereas the tertiary light source having the red light-emitting device may be provided separately from the layer. Alternatively, the primary light source and the tertiary light source may be provided adjacently to each other whereas the layer containing the first fluorescent material may be formed around the two light sources. More alternatively, light emitted from the primary light source and light emitted from the tertiary light source may be collected once so that the first fluorescent material can be irradiated with a part of the collected light. In this case, the secondary light source is disposed at a predetermined distance from the primary and tertiary light sources.

The secondary fluorescent material and the semiconductor red light-emitting device may be used in combination as the tertiary light source. In such a configuration, the light color of the light-emitting apparatus as a whole can be controlled by adjustment of the lighting condition of the semiconductor red light-emitting device.

Features and advantages of the invention will be evident from the following detailed description of the preferred embodiments described in conjunction with the attached drawings.

BRIEF DESCRIPTION OF THE DRAWINGS

In the accompanying drawings:

FIG. 9 is a view showing a signal machine 300 as a further embodiment according to the first aspect of the present invention;

DETAILED DESCRIPTION OF THE PREFERRED EMBODIMENTS

The configuration of the present invention will be described below more in detail in connection with the following embodiments.

Embodiment 1

Figure 1:
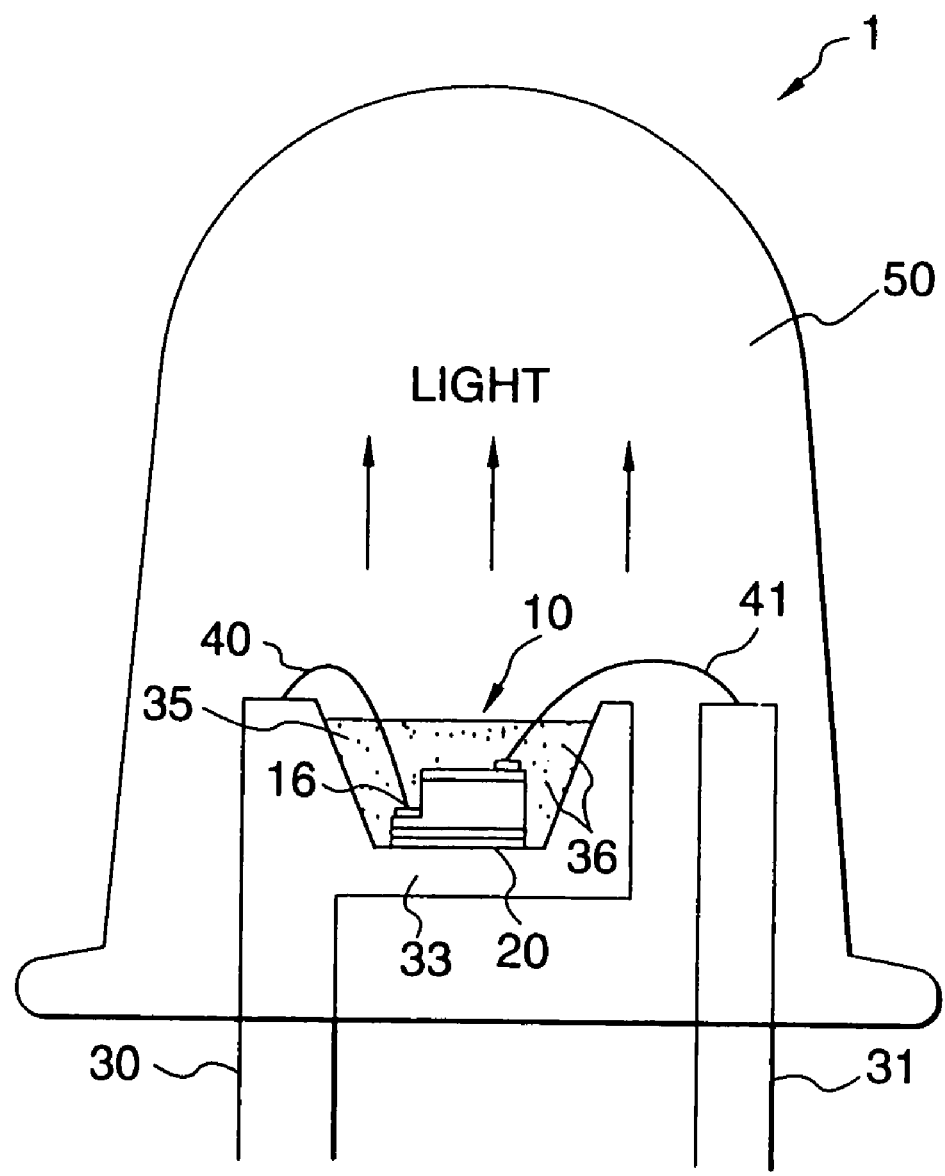
FIG. 1 is a view showing a light-emitting apparatus 1 as an embodiment according to a first aspect of the present invention.
Figure 2:
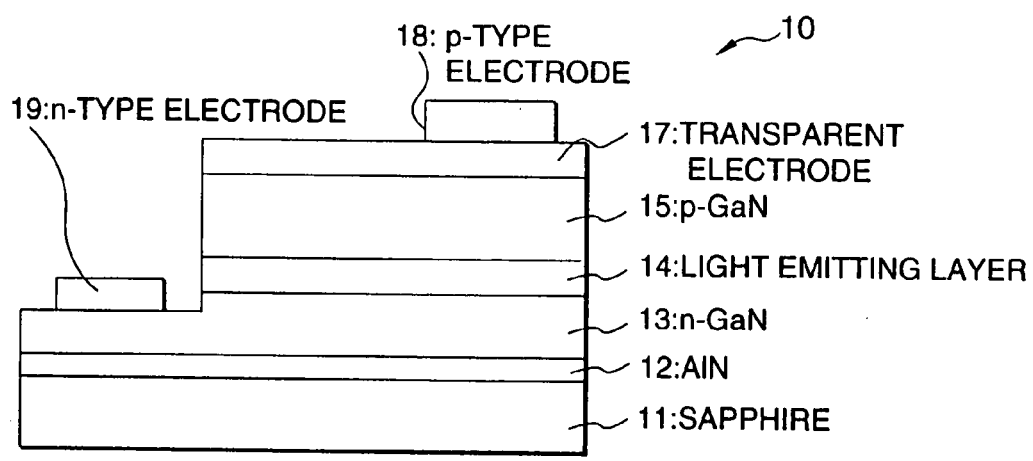
FIG. 2 is a schematic sectional view of a light-emitting device 10 used in the light-emitting apparatus 1.

FIG. 1 is a view showing a light-emitting apparatus 1 as an embodiment according to a first aspect of the present invention. FIG. 2 is a sectional view showing a light-emitting device 10 used in the light-emitting apparatus 1.

Specifications of respective layers in the light-emitting device 10 are as follows.

| Layer | Composition | Dopant | (Thickness) |
|---|---|---|---|
| p-type layer 15 | p-GaN | Mg | (0.3 μm) |
| Light-emitting layer 14 | Superlattice structure | | |
| Quantum well layer | In$_{0.15}$Ga$_{0.85}$N | | (3.5 nm) |
| Barrier layer | GaN | | (3.5 nm) |
| The number of repetition of quantum well and barrier layers: 1 to 10 | | | |
| n-type layer 13 | n-GaN | Si | (4 μm) |
| Buffer layer 12 | AlN | | (10 nm) |
| Substrate 11 | Sapphire | | (300 μm) |

The buffer layer 12 is used for growing a high-quality semiconductor layer and is formed on a surface of the substrate 11 by a known method such as an MOCVD method. Although this embodiment showed the case where AlN was used as a buffer layer, the material of the buffer layer is not limited thereto. For example, the buffer layer may be composed of binary compounds such as GaN and InN. Generally, it may be composed of a group III nitride compound semiconductor represented by the formula $Al_xGa_yN$ ($0 \leq x \leq 1$, $0 \leq y \leq 1$, $x+y=1$) (ternary compounds). Further, it may be composed of a group III nitride compound semiconductor represented by the formula $Al_aGa_bIn_{1-a-b}N$ ($0 \leq a \leq 1$, $0 \leq b \leq 1$, $a+b \leq 1$) quaternary compounds.

Each of the semiconductor layers is formed by a known MOCVD method. In the growth method, an ammonia gas and group III element alkyl compound gases such as trimethylgallium (TMG), trimethylaluminum (TMA) and trimethylindium (TMI) are supplied onto a substrate heated to a suitable temperature and are subjected to a thermal decomposition reaction to thereby make a desired crystal grown on the buffer layer 12. It is a matter of course that the method for forming the semiconductor layers is not limited to the above description and that the semiconductor layers may be formed by a known MBE method.

The structure of the light-emitting layer 14 is not limited to the superlattice structure. The structure may be of a single or double hetero type or of a homo-junction type. Alternatively, the light-emitting layer may be formed by use of an MIS junction or a PIN junction.

A layer of $Al_XGa_YIn_{1-X-Y}N$ ($0 \leq X \leq 1$, $0 \leq Y \leq 1$, $X+Y \leq 1$) doped with an acceptor such as magnesium and having a wide band gap may be interposed between the light-emitting layer 14 and the p-type layer 15. This is because electrons imported into the light-emitting layer 14 are prevented from diffusing into the p-type layer 15.

The p-type layer 15 may be of a double-layered structure with a p⁻ layer of low hole density on the light-emitting layer 14 side and a p⁺ layer of high hole density on the p-type electrode 18 side.

An n-type electrode 19 is constituted by two layers of Al and V. After the p-type layer 15 is formed, the p-type layer 15, the light-emitting layer 14 and the n-type layer 13 are partially removed by etching. Then type electrode 19 is formed on the exposed portion of the n-type layer 13 by vapor deposition.

A transparent electrode 17 is composed of a thin film containing gold. The transparent electrode 17 is laminated on the p-type layer 15 so as to cover the substantially whole upper surface of the p-type layer 15. Also a p-type electrode 18 is composed of a material containing gold. The p-type electrode 18 is formed on the transparent electrode 17 by vapor deposition.

After the semiconductor layers and the electrodes are formed by the aforementioned process, the step of separating the laminate into chips is carried out.

Figure 3:
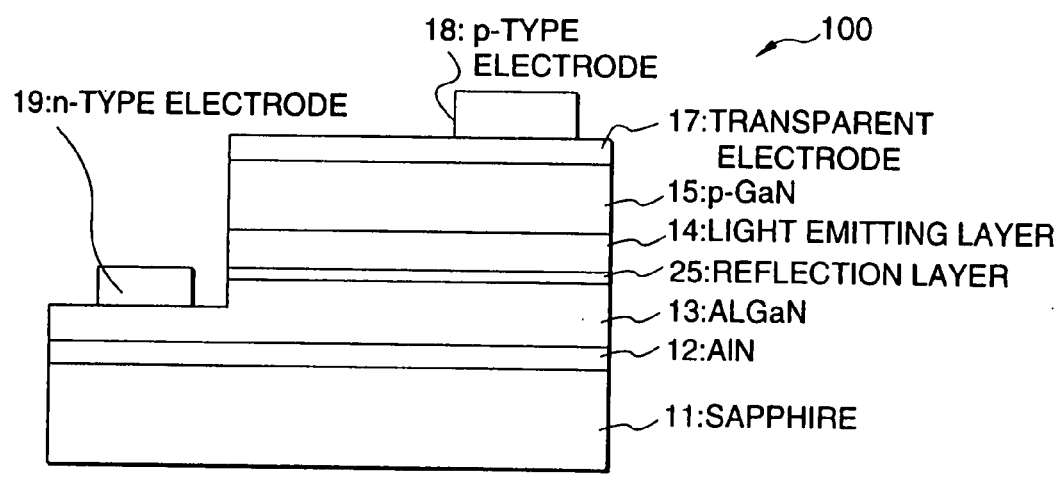
FIG. 3 is a schematic sectional view of another configuration of alight-emitting device 100 having a reflection layer just under the light-emitting layer.
Figure 4:
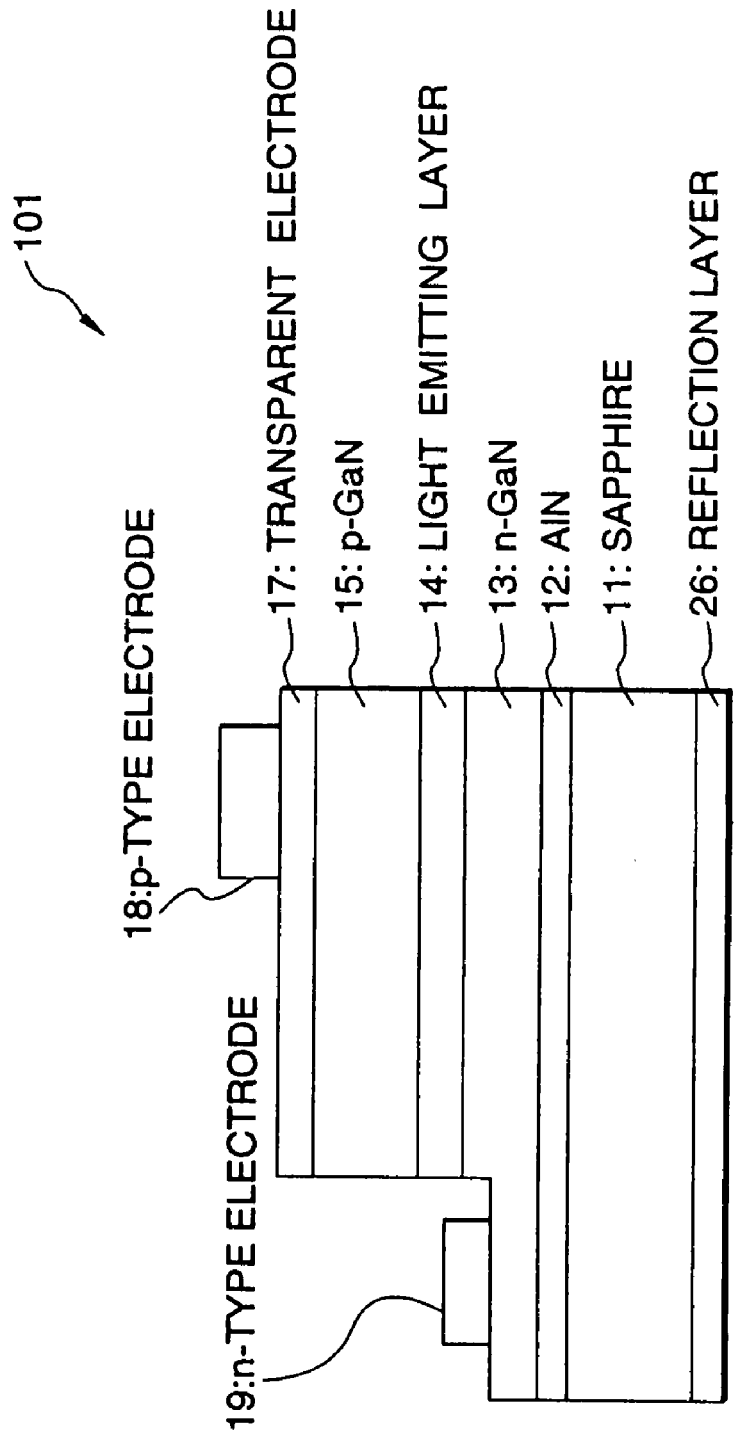
FIG. 4 is a schematic sectional view of a light-emitting device 101 having a reflection layer on a surface the substrate on which any semiconductor layer is not formed.

A reflection layer may be provided between the light-emitting layer 14 and the substrate 11 or on a surface of the substrate 11 on which no semiconductor layer is formed. When such a reflection layer is provided, light emitted from the light-emitting layer 14 toward the substrate can be efficiently reflected toward a light extracting direction. As a result, improvement of light-emitting efficiency can be achieved. FIGS. 3 and 4 show light-emitting devices 100 and 101, respectively, each of which has such a reflection layer. Incidentally, in the light-emitting devices 100 and 101, parts the same as those in the light-emitting device 10 are referenced correspondingly.

In the light-emitting device 100, a reflection layer 25 is formed just under the light-emitting layer 14. In the light-emitting device 101, a reflection layer 26 is formed on a surface of the substrate 11 on which no semiconductor layer is formed. The reflection layer 25 is composed of metal nitride. Preferably, at least one member selected from the group consisting of titanium nitride, zirconium nitride and tantalum nitride may be used optionally as the metal nitride. Like the reflection layer 25, the reflection layer 26 can be composed of metal nitride. Alternatively, the reflection layer 26 may be composed of a single metal such as Al, In, Cu, Ag, Pt, Ir, Pd, Rh, W, Mo, Ti, Ni, or may be composed of an alloy containing a plurality of metals selected optionally from the aforementioned metals.

The light-emitting device 10 is mounted onto a cup portion 33 of a lead frame 30 through an adhesive agent 20. The adhesive agent 20 is prepared as a silver paste which contains an epoxy resin, and silver as a filler mixed in the epoxy resin. Use of such a silver paste is suitable for improving radiation of heat from the light-emitting device 10.

The cup portion 33 is filled with an epoxy resin (hereinafter referred to as "fluorescent material resin") 35 containing a fluorescent material 36 dispersed therein uniformly. After wire bonding which will be described later, the cup portion 33 may be filled with the epoxy resin containing the fluorescent material 36. Alternatively, before the light-emitting device 10 is mounted onto the cup portion 33, a layer containing the fluorescent material 36 may be formed on a surface of the light-emitting device 10. For example, the light-emitting device 10 may be dipped into the epoxy resin containing the fluorescent material 36 so that a fluorescent material resin layer is formed on a surface of the light-emitting device 10. Then, the light-emitting device 10 is mounted onto the cup portion 33 by use of the silver paste. Besides dipping, sputtering, coating, painting, may be used as a method for forming the fluorescent material resin layer.

In this embodiment, ZnS:Cu, Au, Al (named "P22-GY" with an emission peak of 535 nm and made by KASEI OPTONIX Ltd.) is used as the fluorescent material 36. Although this embodiment showed the case where an epoxy resin was used as a base material for dispersing the fluorescent material 36, the base material is not limited to the epoxy resin. For example, a transparent material such as silicone resin, urea resin, glass, may be used as the base material.

Although this embodiment showed the case where the fluorescent material 36 was dispersed into the fluorescent material resin 35 uniformly, the present invention may be applied also to the case where the concentration distribution of the fluorescent material 36 in the fluorescent material resin 35 has a gradient. For example, epoxy resins different in the concentration of the fluorescent material 36 may be used so that a plurality of fluorescent material resin layers different in the concentration of the fluorescent material 36 are formed in the cup portion 33. Alternatively, the concentration of the fluorescent material 36 can be changed continuously.

The fluorescent material resin 35 may contain a diffuser such as titanium oxide, titanium nitride, tantalum nitride, aluminum oxide, silicon oxide, barium titanate.

If a sealing resin 50 which will be described later contains the fluorescent material 36, the fluorescent material resin 35 can be omitted. That is, in this case, the cup portion 33 is filled with the sealing resin 50 containing the fluorescent material 36. Also in this case, the concentration distribution of the fluorescent material 36 in the sealing resin 50 can have a gradient in the same manner as in the fluorescent material resin 35.

The p-type electrode 18 and the n-type electrode 19 in the light-emitting device 10 are wire-bonded to lead frames 31 and 30 by wires 41 and 40 respectively.

Then, the light-emitting device 10, a part of the lead frame 30, a part of the lead frame 31 and the wires 40 and 41 are sealed by a sealing resin 50 composed of epoxy resin. The material of the sealing resin 50 is not particularly limited so long as the material is transparent. For example, besides the epoxy resin, silicon resin, urea resin or glass may be used preferably. From the point of view of adhesion to the fluorescent material resin 35 and refractive index, the sealing resin 50 is preferably composed of the same material as that of the fluorescent material resin 35.

The sealing resin 50 is provided for the purpose of protection of the device structure. When the shape of the sealing resin 50 is changed in accordance with the purpose, a lens effect can be given to the sealing resin 50. For example, besides the bullet type shown in FIG. 1, a concave lens type, a convex lens type may be used as the molding type of the sealing resin 50. Further, the sealing resin 50 may be shaped like a circle, an ellipse or a rectangle viewed from the light extracting direction (upward in FIG. 1).

The fluorescent material 36 can be dispersed into the sealing resin 50 regardless of the case where the fluorescent material resin 35 is omitted.

The sealing resin 50 may further contain a diffuser. The use of the diffuser can relax the directivity of light emitted from the light-emitting device 10. Examples of the diffuser to be used include titanium oxide, titanium nitride, tantalum nitride, aluminum oxide, silicon oxide, barium titanate.

The sealing resin 50 may further contain a colorant. The colorant is used for preventing the fluorescent material from exhibiting a peculiar color when the light-emitting device 10 is switched on or off.

When light emitted from the light-emitting device 10 contains a lot of wavelengths in an ultraviolet light region, an ultraviolet light absorber may be contained in the sealing resin 50 so that improvement of the life is achieved.

Incidentally, one member or a plurality of members optionally selected from the fluorescent material 36, the diffuser, the colorant and the ultraviolet light absorber can be contained in the sealing resin 50.

In addition to the light-emitting device 10, any other light-emitting device may be used. A light-emitting device different in emission wavelength from the light-emitting device 10 can be used as the other light-emitting device. Preferably, the other light-emitting device is provided as a light-emitting device having an emission wavelength which does not substantially excite the fluorescent material to emit light. The use of the other light-emitting device permits the light-emitting apparatus to emit also light of a color different from white.

Further, a plurality of light-emitting devices each having the same configuration as the light-emitting device 10 may be used for achieving improvement of luminance.

The light-emitting apparatus 1 according to this embodiment can be used as a light source for lighting a specific member to be irradiated as well as the light-emitting apparatus 1 is used as a light source in a display device, a signal machine, as will be described later. For example, a fluorescent material is used as the member to be irradiated. For use of the fluorescent material as the member to be irradiated, a fluorescent coating composition is applied onto the member to be irradiated or is mixed with a material for forming the member to be irradiated. When the member to be irradiated is composed of fiber, fiber containing a fluorescent coating composition as an additional component is woven. When the member as a subject of irradiation is irradiated with light emitted from the light-emitting apparatus 1, the fluorescent material contained in the member as a subject of irradiation is particularly excited by light from the primary light source to emit peculiar light so that the surface design of the member as a subject of irradiation can be changed.

Embodiment 2

Figure 5:
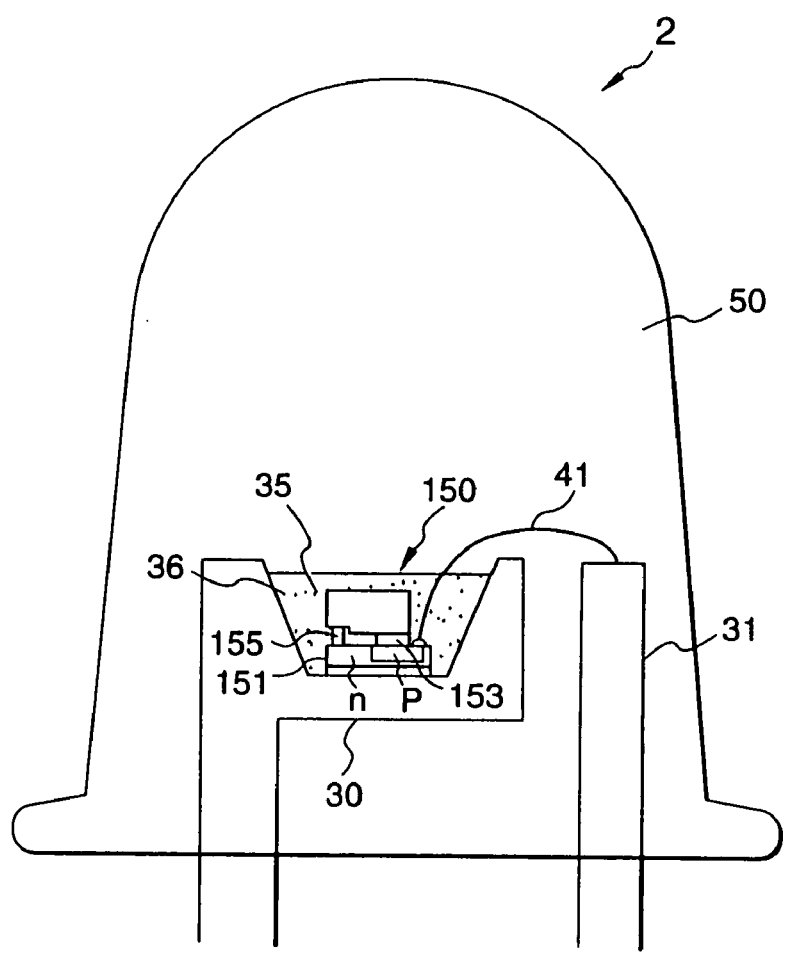
FIG. 5 is a partly enlarged view of a light-emitting apparatus which uses a planer type Zener light-emitting device 150 as another embodiment according to the first aspect of the present invention.

In a light-emitting apparatus 2 as an embodiment according to the first aspect of the present invention, a light-emitting device 150 is used as a light-emitting device. FIG. 5 is an enlarged view of a light-emitting device 150 used in the light-emitting apparatus 2. Parts the same as those in the light-emitting apparatus 1 in Embodiment 1 are referenced correspondingly, and the description thereof will be omitted.

The light-emitting device 150 is prepared in such a manner that the electrodes 17, 18 and 19 are eliminated from the light-emitting device 10 shown in FIG. 1 and the light-emitting device 10 is fixed onto Zener diode 151 of a silicone substrate in the form of a flip chip. The p-type GaN contact layer 15 of the light-emitting device 10 is connected to a p-type region of the Zener diode 151 through a metal electrode layer 153. The material of the metal electrode layer 153 is not particularly limited so long as ohmic contact can be obtained between the Zener diode 151 and the p-type GaN contact layer 15. For example, a gold alloy, can be used as the material of the metal electrode layer 153. The n-type GaN contact layer 13 of the light-emitting device 10 is connected to an n-type region of the Zener diode 151 through a metal electrode layer 155. The material of the metal electrode layer 155 is not particularly limited so long as ohmic contact can be obtained between the Zener diode 151 and the n-type GaN contact layer 13. For example, an aluminum alloy, can be used as the material of the metal electrode layer 155. The p-type region of the Zener diode 151 is connected to the lead frame 31 by the wire 41.

Embodiment 3

Figure 6:
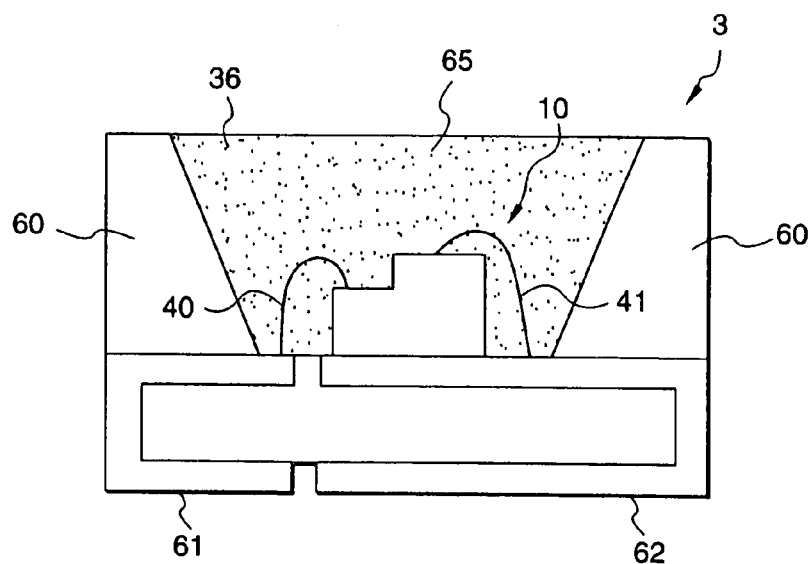
FIG. 6 is a view showing a chip type LED 3 as a further embodiment according to the first aspect of the present invention.

FIG. 6 is a sectional view of a chip type LED 3 as an embodiment according to the first aspect of the present invention. Parts the same as those in the light-emitting apparatus 1 in Embodiment 1 are referenced correspondingly and the description thereof will be omitted. The light-emitting device 10 is fixed into a box 60 by silver paste. The wires 40 and 41 connect the electrodes of the light-emitting device 10 to electrodes 61 and 62, respectively, provided in the box 60. A sealing resin 65 is prepared by dispersing the fluorescent material 36 of ZnS:Cu, Au, Al (named "P22-GY" with an emission peak of 535 nm and made by KASEI OPTONIX Ltd.) uniformly into a transparent substrate of epoxy resin, silicon resin, urea resin. The light-emitting device 10 and the wires 40 and 41 are covered with the sealing resin 65. The chip type LED 3 emits white light as a whole on the basis of mixture of the light emitted from the fluorescent material 36 excited by light emitted from the light-emitting device 10 and the light directly extracted from the light-emitting device 10.

Embodiment 4

Figure 7:
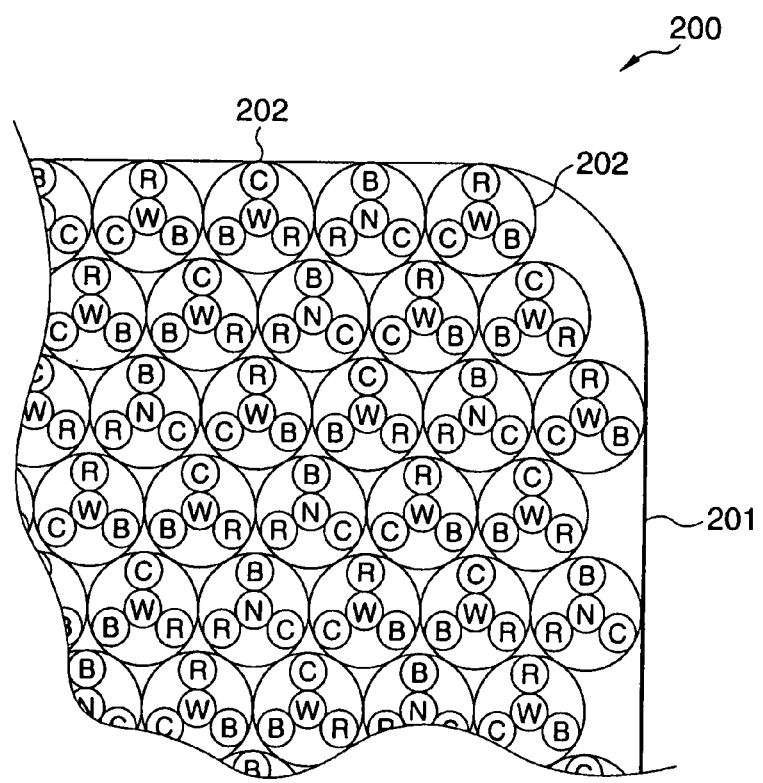
FIG. 7 is a partly enlarged view of a display device 200 as a further embodiment according to the first aspect of the present invention.

FIG. 7 is a partly enlarged view of a display device 200 using the light-emitting apparatus 1 (hereinafter referred to as "W-LED") shown in Embodiment 1 in combination with RGB LEDs. The display device 200 can be applied to a full-color LED display.

The display device 200 has an approximately rectangular display portion 201. A matrix of LED units 202 each composed of RGB LEDs and a W-LED is disposed in the display portion 201. The arrangement of the LEDs in each of the LED units 202 can be selected optionally.

Figure 8:
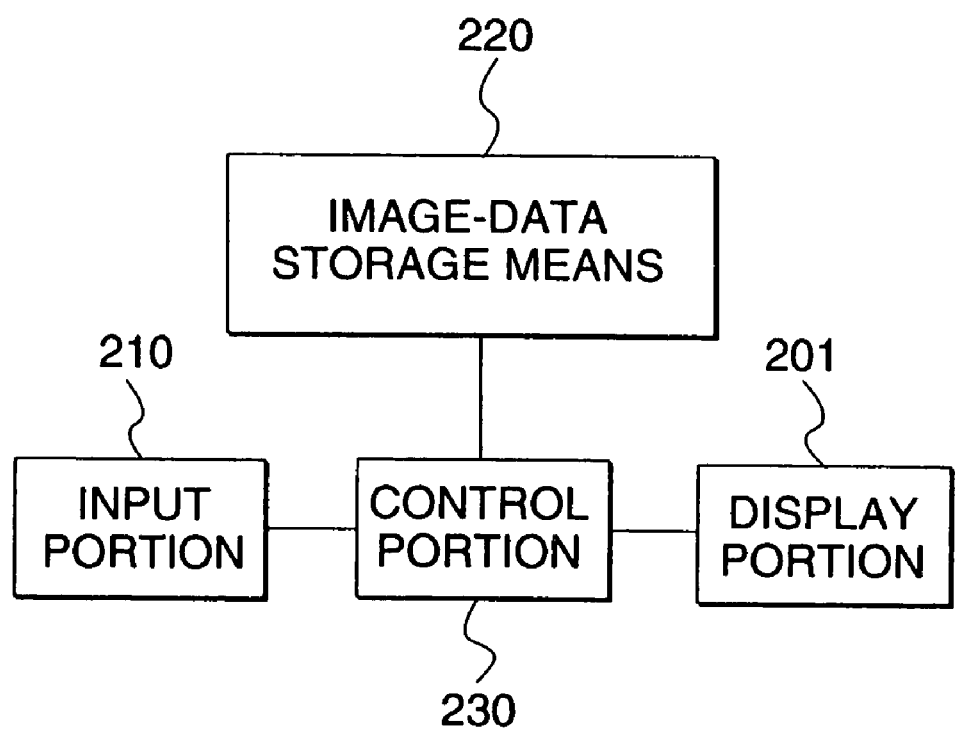
FIG. 8 is a view showing circuit configuration of the display device 200.

A display method used in the display device 200 will be described below with reference to FIG. 8. Image data given from an input portion 210 is temporarily stored in an image data storage means 220. A control portion 230 includes a pattern selection circuit, a brightness modulation circuit and a light switching circuit which are not shown. The control portion 230 outputs a control signal for controlling the on/off state of each of the LED units 202 in accordance with the image data stored in the image data storage means 220. Each of the LED units 202 is lighted with brightness and color on the basis of the control signal, so that a specific shape is displayed with specific brightness and color on the display portion 201.

In the display device 200, each of the LED units 202 is composed of a combination of RGB LEDs and a W-LED. However, if LED units each composed of a W-LED alone are arranged in the form of a matrix to thereby form a display portion 201, it is possible to obtain a display device which can display any shape, with white (by switching on a W-LED) and black (by switching off a W-LED). Also in this case, the brightness of each of the LED units can be controlled in tone so that the LED units can be applied to a monochrome LED display.

Embodiment 5

FIG. 9 is a view showing a vehicle signal machine 300 using chip type LEDs 3 described above. The signal machine 300 has a display portion 302. A matrix of chip type LEDs 3 is disposed in the display portion 302. In FIG. 9, the reference numeral 301 designates a box. The display portion 302 is covered with a transparent colored cover which is not shown. The on/off state of each of the LEDs 3 is controlled by a control means. White light generated when the LED 3 is turned on is colored visibly by passing through the transparent colored cover. It is a matter of course that a transparent colorless cover may be used for making the signal machine display white. Power supply to the LEDs 3 is achieved by parallel or series connection of the respective LEDs 3. When the LEDs are series-connected, the LEDs 3 may be divided into a plurality of groups so that power is supplied to each group. When, for example, such LED groups are disposed concentrically in the display portion 302, the display portion 302 can be provided as a portion having the LEDs disposed circularly as a whole. Incidentally, control of the on/off state may be performed for each LED group.

The use of such a matrix of chip type LEDs 3 to form a light source permits the light source to emit light with uniform brightness on the whole display portion. Hence, brightness irregularity caused by use of electric bulbs in the background art can be reduced. The control of the on/off state for each LED group in the aforementioned manner permits the display portion to perform display partially different in brightness.

Incidentally, the method for arranging the chip type LEDs 3 and the density in arrangement thereof can be selected optionally in accordance with purposes.

Embodiment 6

Figure 10A:
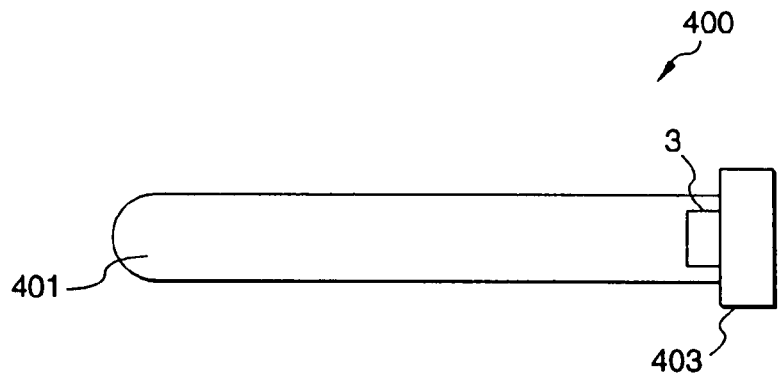
FIGS. 10A and 10B are views showing a linear light source 400 and a surface light source 500 as a further embodiment according to the first aspect of the present invention.
Figure 10B:
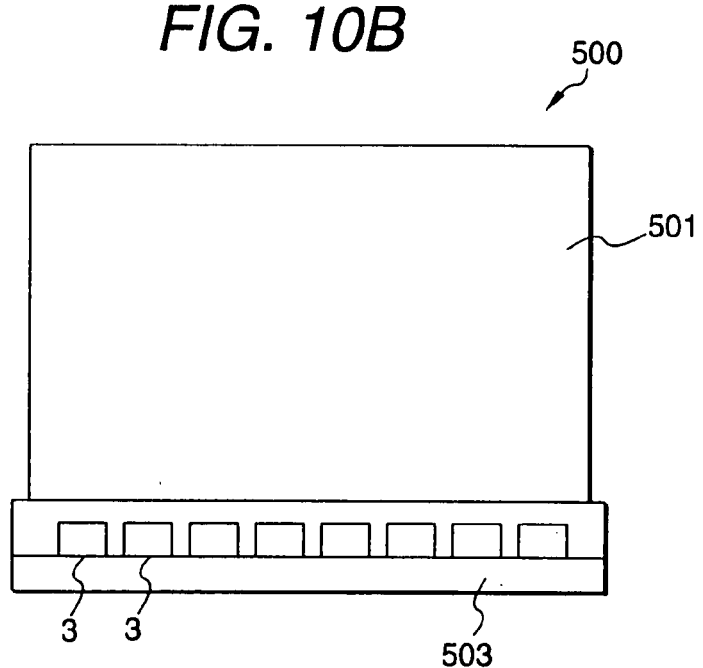

FIGS. 10A and 10B show a linear light source 400 and a surface light source 500 using chip type LEDs 3 described above.

The linear light source 400 roughly has a chip type LED 3, a light guide 401, and a box 403. The light guide 401 is composed of epoxy resin. It is a matter of course that any other transparent resin, may be used as the light guide. The light guide 401 uniformly contains a diffuser not shown, so that uniform light emission can be made. Although this embodiment showed the case where a transparent light guide was used, the present invention may be applied also to the case where the light guide is colored so that the linear light source can be provided for emitting light of a specific color. Alternatively, a suitable fluorescent material may be contained in the light guide so that the linear light source can be provided for emitting light of a specific color on the basis of the fluorescent function of the fluorescent material. For example, the linear light source 400 can be used as an indicator in any kind of meter.

The surface light source 500 has a box 503, a plurality of chip type LEDs 3 linearly arranged in the box 503, and a planar light guide 501 attached to the box 503 in a direction of light emission of the LEDs 3. The light guide 501 is composed of epoxy resin containing a diffuser not shown. Reflection members may be disposed on the back of the light guide 501 and on a side in which the LEDs 3 are not disposed. The provision of such reflection members improves frontal light-emitting efficiency. Hence, for example, the surface light source can be utilized as a light source having brightness sufficient to be adapted to a backlighting unit of a liquid-crystal monitor used in a personal computer.

Embodiment 7

Figure 11:
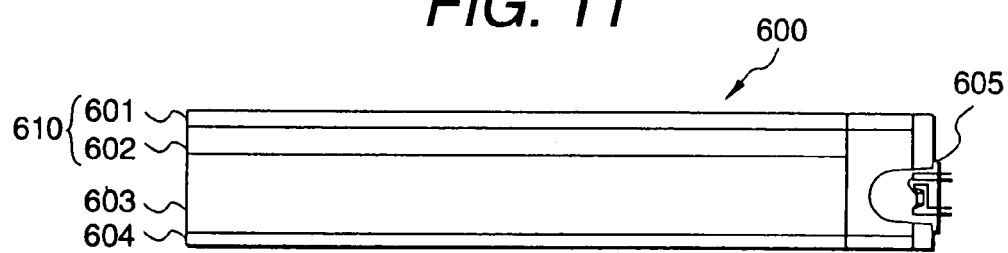
FIG. 11 is a view showing a color conversion filter 600 as a further embodiment according to the first aspect of the present invention.

FIG. 11 is a view showing a color conversion filter 600 using an LED 605. The color conversion filter 600 roughly has an LED 605, a color conversion sheet 610, and a light guide layer 603.

The LED 605 is configured in the same manner as in the light-emitting apparatus 1 according to Embodiment 1 except that the cup portion 33 is also filled with the sealing resin 50 instead of the epoxy resin 35 containing the fluorescent material 36. Incidentally, the chip type LED may be used.

The color conversion sheet 610 has a fluorescent material layer 601, and a transparent sheet 602 composed of transparent resin. The fluorescent material layer 601 is prepared by dispersion of a fluorescent material of ZnS:Cu, Au, Al (named "P22-GY" with an emission peak of 535 nm and made by KASEI OPTONIX Ltd.) into a transparent substrate of epoxy resin, silicon resin, urea resin. In this embodiment, PET is used as the material of the transparent sheet 602. The fluorescent material layer 601 is preferably formed to have a finely rough surface. This is because the fluorescent material layer 601 and glass, disposed on an upper surface of the fluorescent material layer 601 are fitted to each other well to thereby prevent light from blurring in the interface therebetween. Also a contact surface of the transparent sheet 602 and the light guide layer 603 is preferably provided as a finely rough surface. This is because the transparent sheet 602 is prevented from coming into close contact with the light guide layer 603 to thereby prevent light from blurring in the interface therebetween.

The light guide layer 603 is composed of epoxy resin. It is a matter of course that the light guide layer 603 may be composed of any other transparent resin such as silicon resin. A reflection layer 604 is formed on a lower surface of the light guide layer 603 so that light is prevented from leaking out from the lower surface of the light guide layer 603. The material of the reflection layer 604 is not particularly limited or the reflection layer 604 may be omitted.

Light emitted from the LED 605 is incident on a side surface of the light guide layer 603 and extracted from the fluorescent material layer 601 side. When the light passes through the fluorescent material layer 601, a part of the light emitted from the LED 605 excites the fluorescent material to emit light. The light emitted from the fluorescent material and the light emitted from the LED 605 are mixed together so that white light as a whole is extracted.

In addition to the LED 605, any other LED different in emission wavelength from the LED 605 may be used as a different light source. In this case, the color conversion filter can be provided as a filter which can emit light of various colors in accordance with the on/off control over the LEDs.

Embodiment 8

Figure 12:
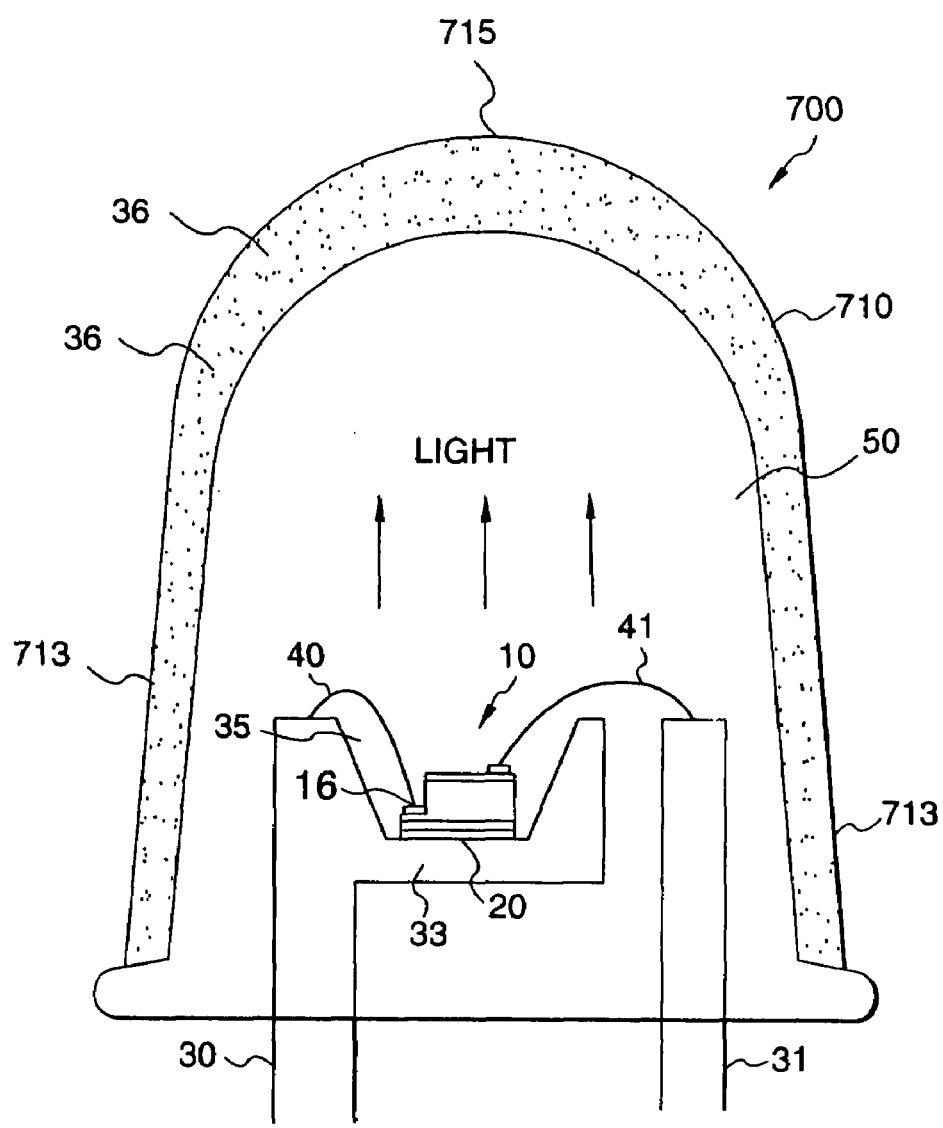
FIG. 12 is a view showing a cap type light-emitting apparatus 700 as a further embodiment according to the first aspect of the present invention.

FIG. 12 is a view showing a cap type light-emitting apparatus 700 as an embodiment according to the first aspect of the present invention. Parts the same as those in the light-emitting apparatus 1 according to Embodiment 1 are referenced correspondingly and the description thereof will be omitted.

The light-emitting apparatus 700 is configured in the same manner as in the light-emitting apparatus 1 except that the cup portion 33 is not filled with the resin containing the fluorescent material and that a fluorescent material layer 710 composed of epoxy resin containing a fluorescent material 36 is formed to cover the sealing resin 50.

Being transmitted through the fluorescent material layer 710, a part of light emitted from the light-emitting device 10 excites the fluorescent material 36 to emit light. The light emitted from the fluorescent material 36 and the light transmitted through the fluorescent material layer 710 and extracted directly from the light-emitting device 10 are mixed together, so that the light-emitting apparatus 700 emits white light as a whole. The fluorescent material layer 710 is formed so that the thickness of its upper portion 715 and the thickness of its side portion 713 are different from each other. The upper portion of the fluorescent material layer 710 mainly in a light extracting direction is thickened so that the light-emitting apparatus 700 can emit light uniformly as a whole.

After the sealing resin 50 is formed, the fluorescent material layer 710 is formed by molding, in the same manner as the sealing resin 50 so that the sealing resin 50 is covered with the fluorescent material layer 710. Alternatively, a resin containing the fluorescent material 36 and shaped like a cap may be prepared so that the resin can be applied onto the sealing resin 50 so that a fluorescent material layer 710 is formed after formation of the sealing resin 50.

Besides the epoxy resin in this embodiment, a thermosetting resin such as urea resin, a thermoplastic resin such as polyethylene may be used as the material of the fluorescent material layer 710.

The fluorescent material layer 710 may further contain a diffuser such as titanium oxide, titanium nitride, tantalum nitride, aluminum oxide, silicon oxide, barium titanate.

Embodiment 9

Figure 13:
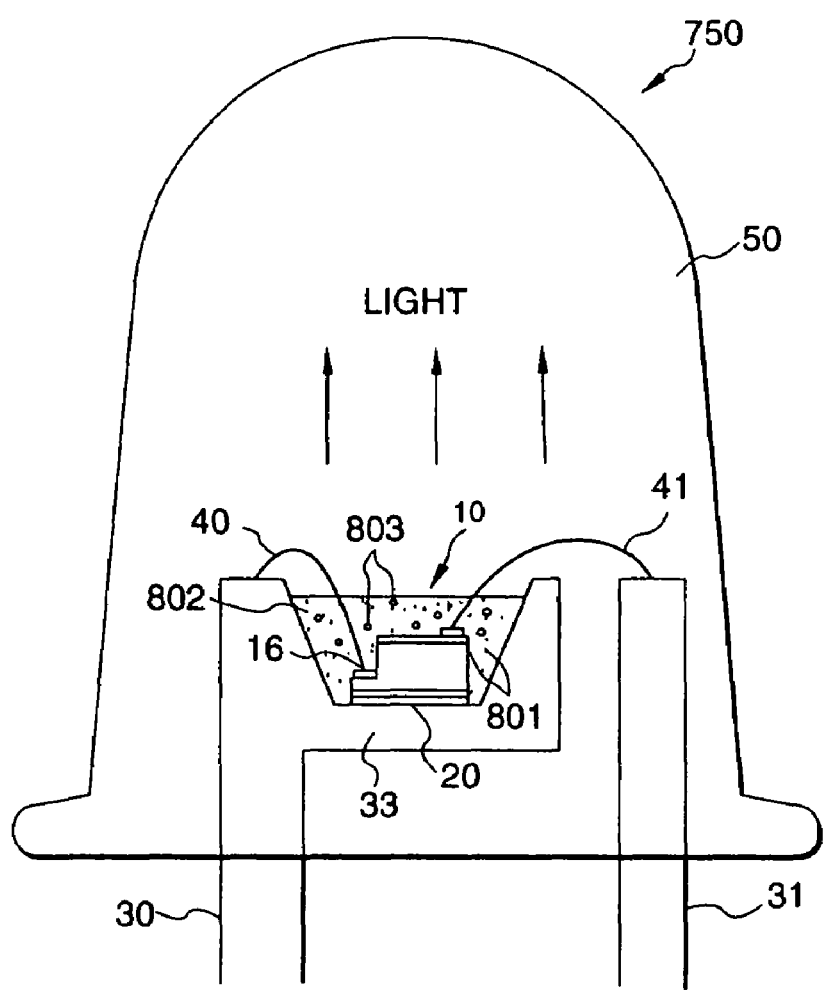
FIG. 13 is a view showing a light-emitting apparatus 750 as an embodiment according to a second aspect of the present invention.

FIG. 13 is a view showing a light-emitting apparatus 750 as an embodiment according to the second aspect of the present invention. Parts the same as those in the light-emitting apparatus 1 according to Embodiment 1 are referenced correspondingly and the description thereof will be omitted.

Specifications of respective layers in the light-emitting device 10 are as described in Embodiment 1. Like Embodiment 1, the light-emitting device 10 can be used as a device having a reflection layer as shown in FIG. 3 or 4.

The cup portion 33 is filled with epoxy resin (hereinafter referred to as "fluorescent material resin") 802 containing two kinds of fluorescent materials 801 and 803 uniformly dispersed therein. In this embodiment, the ratio of the amount of the fluorescent material 801 to the amount of the fluorescent material 803 is set to be in a range of from 4:1 to 6:1. The cup portion 33 may be filled with the fluorescent material resin 802 after wire bonding as will be described later. Alternatively, before the light-emitting device 10 is mounted onto the cup portion 33, a layer containing the fluorescent materials 801 and 803 may be formed on a surface of the light-emitting device 10. For example, the light-emitting device 10 may be dipped into the epoxy resin containing the fluorescent materials so that the fluorescent material resin layer is formed on a surface of the light-emitting device 10 and then the light-emitting device 10 is mounted onto the cup portion 33 by use of silver paste. Besides dipping, sputtering, coating, painting may be used as the method for forming the fluorescent material resin layer.

Figure 14:
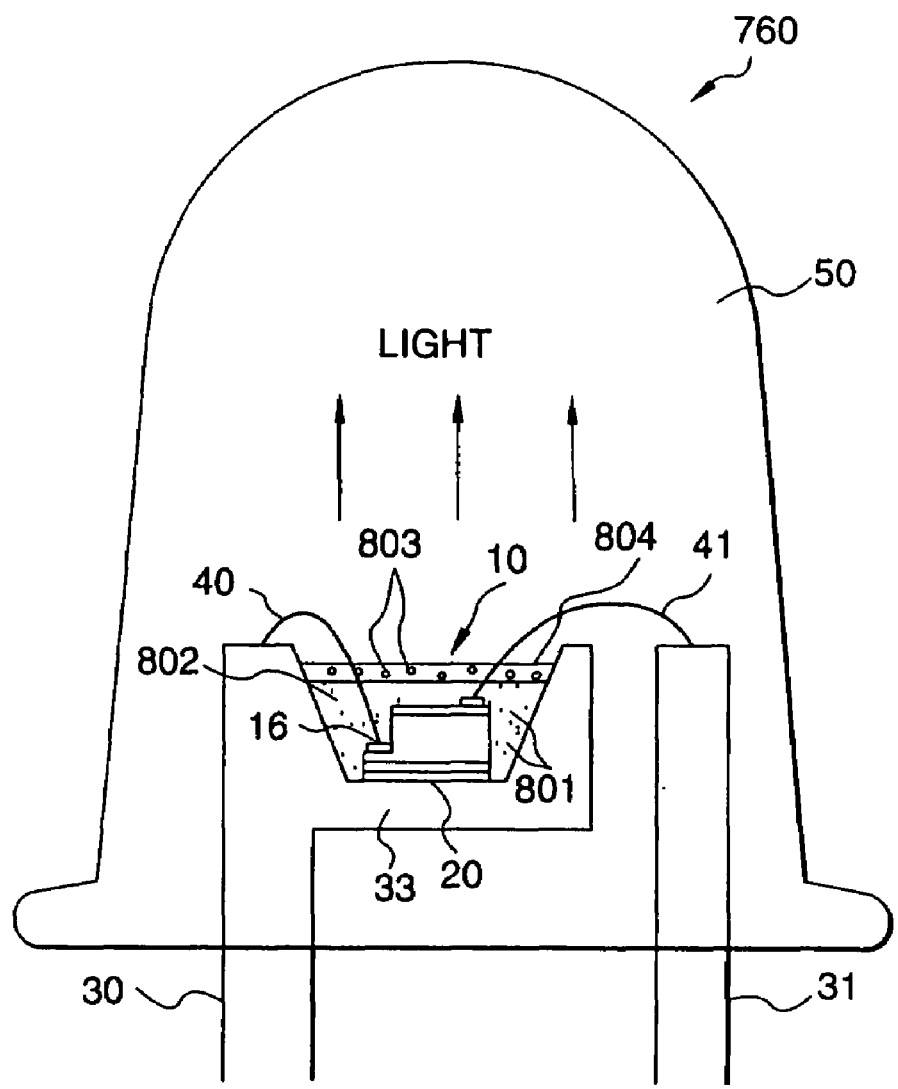
FIG. 14 is a view showing another configuration of a light-emitting apparatus 760.

Incidentally, a configuration in which fluorescent material resin layers 802 and 804 containing fluorescent materials 801 and 803 dispersed therein respectively are laminated successively on the cup portion 33 may be used as in a light-emitting apparatus 760 shown in FIG. 14.

ZnS:Cu, Al (named "P22-GN4" with an emission peak of 530 nm and made by KASEI OPTONIX Ltd.) was used as the fluorescent material 801. Although this embodiment showed the case where epoxy resin was used as a base material for dispersing the fluorescent materials 801 and 803, the base material is not limited to the epoxy resin. For example, a transparent material such as silicon resin, urea resin, glass, may be used. CaS:Eu (named "RAS" with an emission peak of about 645 nm and made by NEMOTO & CO., Ltd.) was used as the fluorescent material 803. The fluorescent material 803 emits pink light when it is excited by blue or blue-green light.

Although this embodiment showed the case where the fluorescent materials 801 and 803 were uniformly dispersed into the fluorescent material resin layer 802, the present invention may be applied also to the case where the concentration distributions of the fluorescent materials are changed stepwise or continuously with gradients respectively. For example, transparent resins different in the amounts (concentrations) of the fluorescent materials 801 and 803 may be laminated successively onto the cup portion 33 so as to cover the light-emitting device 10. Like Embodiment 1, the fluorescent material resin layer 802 may contain any kind of diffuser. Alternatively, like Embodiment 1, the sealing resin 50 may contain the fluorescent materials 801 and 803 so that the fluorescent material resin layer 802 can be omitted.

The n-type and p-type electrodes 18 and 19 of the light-emitting device 10 are wire-bonded to lead frames 30 and 31 by wires 41 and 40 respectively. Then, the light-emitting device 10, a part of the lead frame 30, a part of the lead frame 31 and the wires 40 and 41 are sealed by the sealing resin 50 composed of epoxy resin. Like Embodiment 1, any suitable material and shape may be used as the material and shape of the sealing resin 50. Also like Embodiment 1, the sealing resin 50 may contain a diffuser, a colorant or an ultraviolet light absorber.

In addition to the light-emitting device 10, a red light-emitting device may be used. For example, such a red light-emitting device is disposed into the cup portion 33 so as to be adjacent to the light-emitting device 10. Alternatively, the red light-emitting device may be mounted onto a lead frame provided separately.

The use of the red light-emitting device can compensate for the shortage in the red component of the color of the light emitted from the light-emitting apparatus 750, so that higher-quality white light can be emitted. Moreover, the color of the light emitted from the light-emitting apparatus 750 can be changed by the on/off control of the red light-emitting device.

Moreover, any other light-emitting device than the red light-emitting device may be used additionally. The use of the other light-emitting device permits the light-emitting apparatus to emit also light of a color different from white.

Moreover, a plurality of light-emitting devices 10 may be used for achieving improvement of brightness.

The light-emitting apparatus 750 according to this embodiment is used as a light source in a display device, a signal machine. Like the light-emitting apparatus 1 according to Embodiment 1, the light-emitting apparatus 750 is used as a light source for irradiating a specific member as a subject of irradiation.

Embodiment 10

Figure 15:
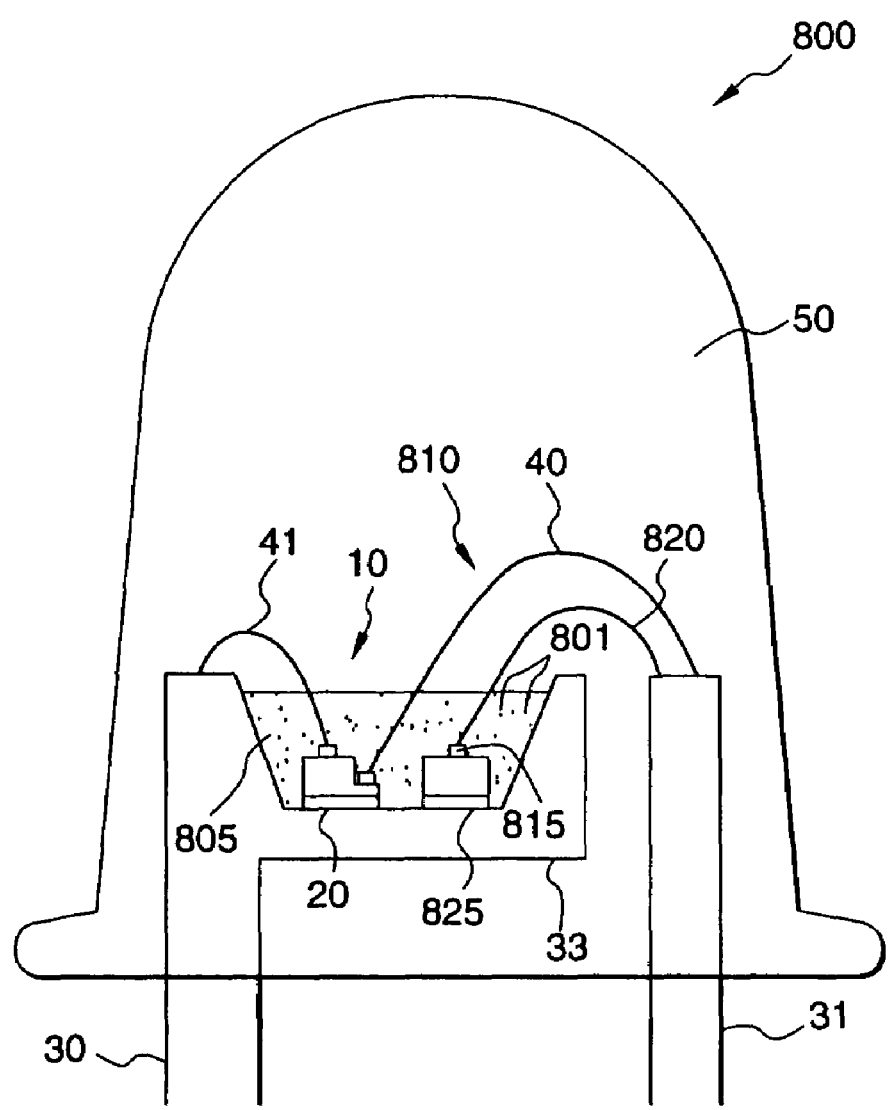
FIG. 15 is a view showing a light-emitting apparatus 800 as an embodiment according to the second aspect of the present invention.

FIG. 15 is a view showing a light-emitting apparatus 800 as an embodiment according to the second aspect of the present invention. Parts the same as those in the light-emitting apparatus 1 according to Embodiment 1 or the light-emitting apparatus 750 according to Embodiment 9 are referenced correspondingly and the description thereof will be omitted.

Specifications of respective layers in the light-emitting device 10 are as explained in Embodiment 1. Like Embodiment 1, the light-emitting device can be provided as a device having a reflection layer as shown in FIG. 3 or 4.

Figure 16:
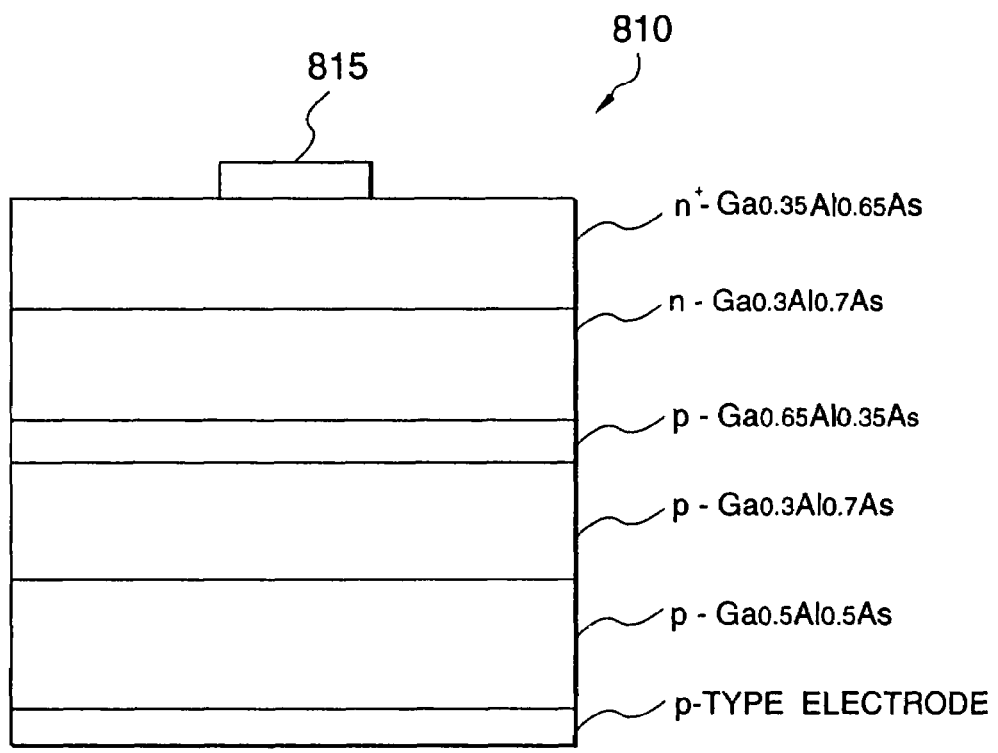
FIG. 16 is a schematic sectional view of a red light-emitting device 810 used in the light-emitting apparatus 800.

A light-emitting device 810 is a red light-emitting device using a gallium-aluminum-arsenic material. FIG. 16 shows the configuration of the light-emitting device 810.

The light-emitting devices 10 and 810 are adjacently mounted onto the cup portion 33 of the lead frame 30 through adhesive agents 20 and 825 respectively.

The cup portion 33 is filled with epoxy resin (hereinafter referred to as "fluorescent material resin") 805 containing the fluorescent material 801 dispersed therein uniformly. After wire bonding as will be described later, the cup portion 33 may be filled with the epoxy resin containing the fluorescent material 801. Alternatively, before the light-emitting devices 10 and 810 are mounted onto the cup portion 33, a layer containing the fluorescent material 801 may be formed on a surface of the light-emitting device 10. For example, the light-emitting device 10 may be dipped into the epoxy resin containing the fluorescent material 801 so that a fluorescent material resin layer is formed on a surface of the light-emitting device 10 and then the light-emitting device 10 may be mounted onto the cup portion 33 by use of silver paste.

Besides dipping, sputtering, coating, painting, may be used as the method for forming the fluorescent material resin layer.

The p-type and n-type electrodes 18 and 19 of the light-emitting device 10 are wire-bonded to lead frames 30 and 31 by wires 41 and 40 respectively. An n-type electrode 815 of the light-emitting device 810 is connected to the lead frame 31 by a wire 820.

Then, the light-emitting devices 10 and 810, a part of the lead frame 30, a part of the lead frame 31 and the wires 40, 41 and 820 are sealed by the sealing resin 50 composed of epoxy resin. Like Embodiment 1, any suitable material and shape can be used as the material and shape of the sealing resin 50. Also like Embodiment 1, the sealing resin 50 may contain a diffuser, a colorant or an ultraviolet light absorber.

In addition to the light-emitting devices 10 and 810, any other light-emitting device may be used. A light-emitting device different in emission wavelength from the light-emitting devices 10 and 810 is used as the other light-emitting device. Preferably, a light-emitting device having an emission wavelength which does not substantially excite the fluorescent material to emit light is used as the other light-emitting device. The use of the other light-emitting device permits the light-emitting apparatus to emit also light of a color different from white.

Moreover, a plurality of light-emitting devices 10 and 810 may be used for achieving improvement of brightness.

Figure 17:
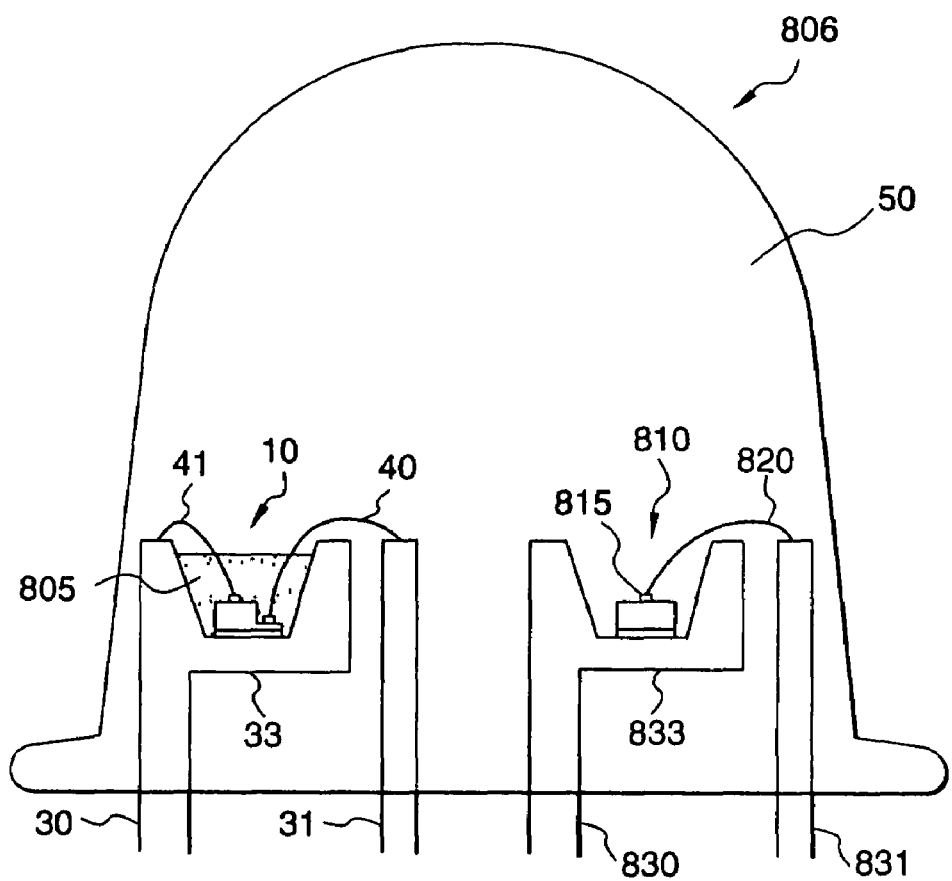
FIG. 17 is a view showing another configuration of a light-emitting apparatus 806.

Although this embodiment showed the case where the light-emitting devices 10 and 810 were mounted onto the cup portion 33 of one lead frame 30, the present invention may be applied also to the case where the light-emitting device 810 is mounted onto a cup portion 833 of a lead frame 830 provided separately as in a light-emitting apparatus 806 shown in FIG. 17. In this case, the n-type electrode 815 of the light-emitting device 810 is connected to a lead frame 831. According to such a configuration, power supply to the light-emitting devices 10 and 810 is performed through different lead frames respectively. Hence, the respective emission modes of the light-emitting devices can be controlled individually, so that the color of light emitted from the light-emitting apparatus as a whole can be adjusted. Alternatively, the lead frame 831 may be omitted and the n-type electrode 815 of the light-emitting device 810 may be connected to the lead frame 31.

Although the light-emitting devices 10 and 810 and the lead frames 30, 31, 830 and 831 are sealed by the sealing resin 50 in the light-emitting apparatus 806 so as to be integrally formed, the light-emitting devices and corresponding lead frames may be sealed individually by sealing resins provided separately, respectively.

The light-emitting apparatus 800 and 806 according to this embodiment is used as a light source in a display device, a signal machine. Like the light-emitting apparatus 1 according to Embodiment 1, the light-emitting apparatus 800 or 806 is used as a light source for irradiating a specific member as a subject of irradiation.

Embodiment 11

Figure 18:
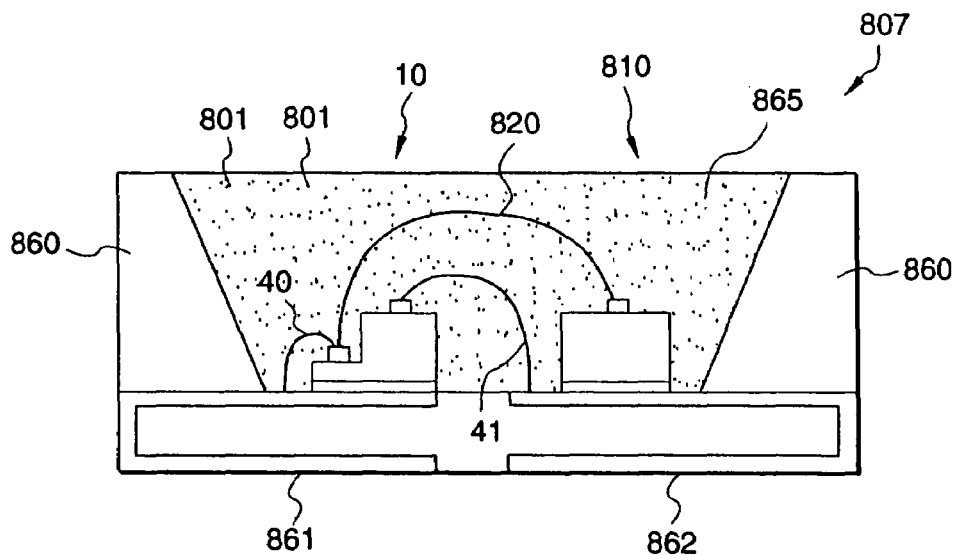
FIG. 18 is a view showing a chip type LED 807 as another embodiment according to the second aspect of the present invention.

FIG. 18 is a sectional view of a chip type LED 807 as an embodiment according to the second aspect of the present invention. Parts the same as those in the light-emitting apparatus 800 according to Embodiment 10 are referenced correspondingly and the description thereof will be omitted.

The light-emitting devices 10 and 810 are fixed into a box 860 by use of silver paste. Wires 40 and 41 connect the electrodes of the light-emitting device 10 to electrodes 861 and 862, respectively, provided in the box. A wire 820 connects the n-type electrode 815 of the light-emitting device 810 to an n-type electrode of the light-emitting device 10. Of course, the n-type electrode 815 of the light-emitting device 810 may be connected directly to the electrode 861 by the wire 820. A sealing resin 865 is prepared by dispersing a fluorescent material 801 of ZnS: Cu, Al (named "P22-GN4" with an emission peak of 530 nm and made by KASEI OPTONIX Ltd.) uniformly into a transparent substrate such as epoxy resin, silicon resin, urea resin. The light-emitting devices 10 and 810 and the wires 40, 41 and 820 are covered by the sealing resin 865. A part of light emitted from the light-emitting device 10 is converted into green light by the fluorescent material 801. The green light, the blue light extracted directly from the light-emitting device 10, and the red light emitted from the light emitting device 810 are mixed together, so that white light is extracted as a whole.

Embodiment 12

Figure 19:
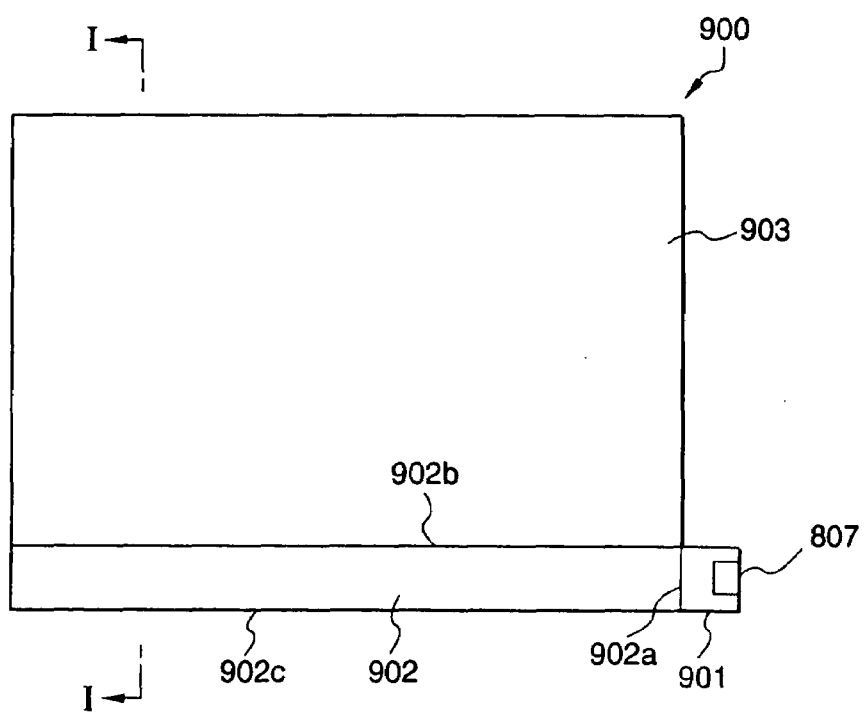
FIG. 19 is a view showing a surface light source 900 used in a full-color liquid-crystal display as a further embodiment according to the second aspect of the present invention.
Figure 20:
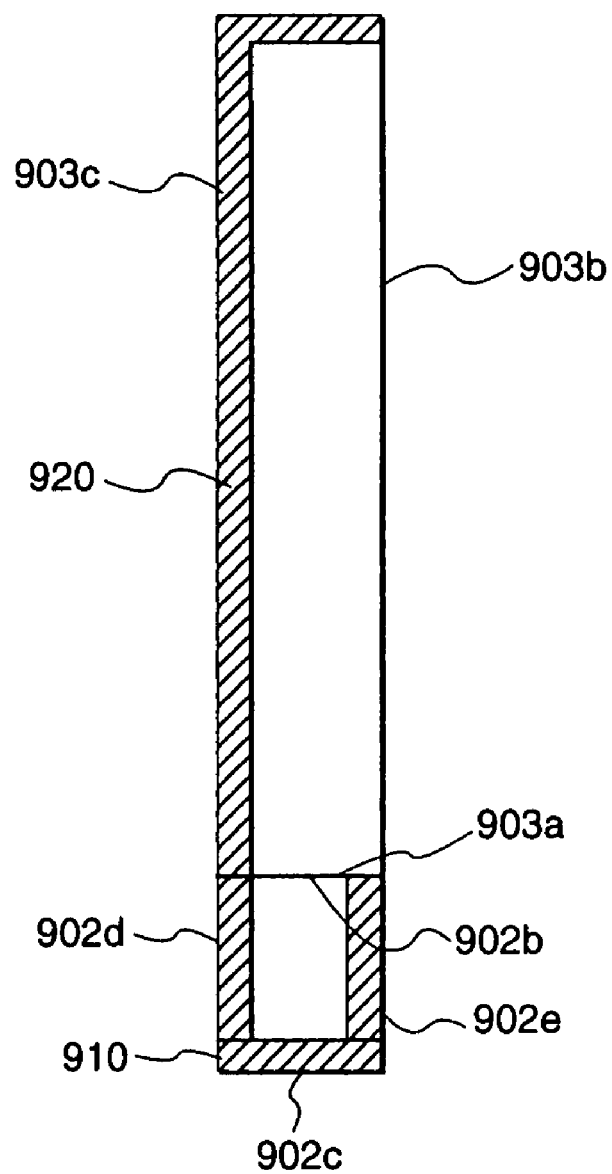
FIG. 20 is a sectional view taken along the line I-I in FIG. 19 and similarly showing the surface light source 900.

FIG. 19 is a front view of a surface light source 900 using the chip type LED 807. FIG. 20 is a sectional view taken along the line I-I in FIG. 19. The surface light source 900 is preferably used as a back-lighting unit for a full-color liquid-crystal display.

The surface light source 900 has a light source portion 901, a first light guide plate 902 shaped like a rod, and a second light guide plate 903 shaped like a plane. The light source portion 901 includes the chip type LED 807 as a light source.

The chip type LED 807 is an LED according to Embodiment 11 and emits white light. Although this embodiment showed the case where light emitted from the LED 807 was imported into the first light guide plate 902 from a side (surface 902a side), it is a matter of course that the present invention is not limited thereto. For example, the light source portion 901 may be provided under the first light guide plate 902 so that light can be imported into the first light guide plate 902 from below (surface 902c side) the first light guide plate 902.

The number of the LEDs 807 to be used is not limited. For example, a plurality of LEDs 807 may be used.

The first light guide plate 902 is composed of a transparent material. Examples of the transparent material to be used are methacrylic resin, polycarbonate resin. Light emitted from the LED 807 is imported into the first light guide plate 902 from a light entrance surface 902a facing the LED 807. The imported light is released from a light release surface 902b facing the second light guide plate 903. Side surfaces 902c, 902d and 902e of the first light guide plate 902 other than the light entrance surface 902a and the light release surface 902b are surface-roughened to thereby form a light reflection layer 910 so that light can be released uniformly from the light release surface 902b and that light can be prevented from leaking out from the side surfaces. Examples of the surface-roughening process are etching, sandblasting, electric discharging. The surface-roughening process may be replaced by white printing or white tape sticking in order to form such a light reflection layer 910. The light reflection layer 910 is preferably formed so that its density decreases as its location comes nearer the LED 807 and that its density increases continuously or stepwise as its location goes farther from the LED 807. In this manner, efficient light reflection and diffusion can be performed in a region far from the LED 807. As a result, light can be released uniformly as a whole regardless of the distance from the LED 807.

The light released from the light release surface 902b of the first light guide plate 902 is imported into the second light guide plate 903 from a light entrance surface 903a of the second light guide plate 903. The second light guide plate 903 is composed of a transparent material. For example, like the first light guide plate, the second light guide plate 903 may be composed of methacrylic resin, polycarbonate resin.

The light imported from the light entrance surface 903a is released out from a light release surface 903b. A light reflection layer 920 is formed on a side surface 903c of the second light guide plate 903 opposite to the light release surface 903b, by surface-roughening, white printing or white tape sticking. Examples of the surface-roughening process are etching, sandblasting, electric discharging. The light reflection layer 920 is preferably formed so that its area or density increases as its location goes farther from the light entrance surface 903a. In this manner, light can be reflected and diffused efficiently in a region far from the light entrance surface 903a, so that light can be released from the light release surface 903b uniformly as a whole.

Although this embodiment showed the case where the LED 807 was used as a light source, it is a matter of course that the LED 807 may be replaced by the light-emitting apparatus 750 or 760 according to Embodiment 9. Alternatively, the white LED may be replaced by a combination of a blue LED and a red LED as a light source. In this case, a color conversion layer containing a fluorescent material is provided separately. For example, such a color conversion layer may be provided between the light source portion 901 and the first light guide plate 902 or between the first and second light guide plates 902 and 903. Alternatively, a fluorescent material may be dispersed into the first light guide plate 902 so that a color conversion layer is formed.

According to such a configuration, when light emitted from the blue LED passes through the color conversion layer, a part of the light excites the fluorescent material to emit green light. The green light, the blue light emitted from the blue LED and the red light emitted from the red LED are mixed together to thereby generate white light. The mixture of light is performed more efficiently when a light diffuser is dispersed into the color conversion layer. Alternatively, a light diffuser may be dispersed into the first light guide plate 902 so that the mixture of light can be performed in the first light guide plate 902. More alternatively, a light diffusing layer may be provided separately.

Although the preferred embodiments of the light-emitting apparatus according to the second aspect of the present invention have been described, application of the light-emitting apparatus according to the second aspect is not limited to the aforementioned embodiments. For example, the light-emitting apparatus according to the second aspect may be applied also to a display device, a signal machine, a linear light source, a surface light source, a color conversion filter or a cap type light-emitting apparatus as an embodiment according to the first aspect of the present invention.

The present invention is not limited to the mode for carrying out the invention and the embodiment thereof at all, and includes various modifications which can be conceived easily by those skilled in the art, without departing from the scope of claim.

What is claimed is:

1. A light-emitting apparatus, comprising:
    a first light source comprising a first semiconductor light-emitting element that emits a blue light;
    a second light source comprising:
        a first fluorescent material that absorbs said blue light emitted by said first light source and emits a green light; and
        a fluorescent material resin, said first fluorescent material being dispersed within said fluorescent material resin; and
    a third light source comprising a second semiconductor light-emitting element that emits a red light,
    wherein said second light source surrounds outer peripheries of said first light source and said third light source, and said blue light emitted by said first light source, said green light emitted by said second light source, and said red light emitted by said third light source are mixed to thereby generate white light.

2. A light-emitting apparatus according to claim 1, wherein said first fluorescent material comprises at least one of ZnS:Cu, Au, Al; ZnS:Cu, Al; ZnS:Cu; ZnS:Eu; and $Y_2O_2S$:Ce.

3. A light-emitting apparatus according to claim 1, wherein a concentration of said first fluorescent material continuously changes within said fluorescent material resin, as a function of distance to said first semiconductor light-emitting element and said second semiconductor light-emitting element.

4. A light-emitting apparatus according to claim 1, further comprising a lead frame comprising a cup portion having a bottom surface, on which said first light source and said third light source are mounted.

5. A light-emitting apparatus according to claim 1, wherein the light-emitting apparatus comprises a chip-type LED.

6. A light-emitting apparatus according to claim 1, wherein said first fluorescent material comprises at least one of ZnS:Eu and $Y_2O_2S$:Ce.

7. A light-emitting apparatus according to claim 1, wherein said third light source comprises a second fluorescent material that absorbs said blue light emitted by said first light source and emits said red light.

8. A light-emitting apparatus according to claim 7, wherein said first fluorescent material and said second fluorescent material are dispersed in said fluorescent material resin.

9. A light-emitting apparatus according to claim 8, wherein a portion of said blue light emitted by said first light source is transmitted through said fluorescent material resin, and
    wherein another portion, of said blue light emitted by said first light source is absorbed by said first fluorescent material, which emits said green light, and said second fluorescent material, which emits said red light, and said blue light emitted by said first light source, said green light emitted by said first fluorescent material and said red light emitted by said second fluorescent material, are mixed, to thereby generate a mixed light, emitted from said light-emitting apparatus, different in luminescent color from said blue light emitted from said first light source.

10. A light-emitting apparatus according to claim 1, wherein said first light source comprises a multiple quantum well structure.

11. A light-emitting apparatus according to claim 10, wherein said multiple quantum well structure comprises well layers comprised of InGaN.

12. A light-emitting apparatus according to claim 1, further comprising a sealing member that focuses light emitted from said light-emitting apparatus.

* * * * *